United States Patent
Pradhan et al.

(10) Patent No.: US 10,634,704 B2
(45) Date of Patent: Apr. 28, 2020

(54) OPTICAL POCKELS VOLTAGE SENSOR ASSEMBLY DEVICE AND METHODS OF USE THEREOF

(71) Applicant: Micatu Inc., Horseheads, NY (US)

(72) Inventors: Atul Pradhan, Pittsford, NY (US); Michael Oshetski, Horseheads, NY (US); Scott Stelick, Slaterville Springs, NY (US); Joshua Andrew Sperrick, Corning, NY (US); William Laratta, Paris (FR)

(73) Assignee: MICATU, INC., Horseheads, NY (US)

( * ) Notice: Subject to any disclaimer, the term of this patent is extended or adjusted under 35 U.S.C. 154(b) by 111 days.

(21) Appl. No.: 15/679,624

(22) Filed: Aug. 17, 2017

(65) Prior Publication Data

US 2018/0052192 A1    Feb. 22, 2018

Related U.S. Application Data

(60) Provisional application No. 62/376,147, filed on Aug. 17, 2016, provisional application No. 62/450,784, filed on Jan. 26, 2017, provisional application No. 62/468,091, filed on Mar. 7, 2017.

(51) Int. Cl.
| | | |
|---|---|---|
| *G01R 31/00* | (2006.01) | |
| *G01R 15/24* | (2006.01) | |
| *G01R 1/07* | (2006.01) | |
| *G01R 1/44* | (2006.01) | |

(52) U.S. Cl.
CPC .......... *G01R 15/242* (2013.01); *G01R 1/071* (2013.01); *G01R 1/44* (2013.01); *G01R 15/247* (2013.01)

(58) Field of Classification Search
CPC .... G01R 15/24; G01R 15/242; G01R 15/247; G01R 1/071; G01R 1/44
See application file for complete search history.

(56) References Cited

U.S. PATENT DOCUMENTS

| 5,157,324 A | 10/1992 | Chollet |
| 5,731,579 A | 3/1998 | Woods |
| 5,939,711 A | 8/1999 | Crawford et al. |

(Continued)

FOREIGN PATENT DOCUMENTS

CN    105425020 A    3/2016

OTHER PUBLICATIONS

Sima et al., "Temperature Characteristics of Pockels Electro-Optic Voltage Sensor With Double Crystal Compensation", AIP Advances 6, 055109 (2016).

(Continued)

*Primary Examiner* — Thang X Le
(74) *Attorney, Agent, or Firm* — Pepper Hamilton LLP

(57) ABSTRACT

An optical voltage sensor assembly includes an input fiber-optic collimator positioned and configured to collimate input light beam from a light source. A crystal material is positioned to receive the input light beam from the light source and configured to exhibit the Pockels effect when an electric field is applied through the crystal material. An output fiber-optic collimator is positioned to receive an output light beam from the crystal material and configured to focus the output light beam from the crystal onto a detector. Methods of using the optical voltage sensor assembly are also disclosed.

21 Claims, 16 Drawing Sheets

(56) References Cited

U.S. PATENT DOCUMENTS

| | | | | |
|---|---|---|---|---|
| 6,307,666 B1* | 10/2001 | Davidson | ............ | G01R 15/242 |
| | | | | 250/227.17 |
| 6,373,620 B1* | 4/2002 | Wang | ...................... | G02F 1/292 |
| | | | | 359/298 |
| 6,492,800 B1 | 12/2002 | Woods et al. | | |
| 2003/0025489 A1* | 2/2003 | Davidson | ............... | G01R 15/24 |
| | | | | 324/96 |
| 2004/0095570 A1* | 5/2004 | Stanimirov | .......... | G01R 15/241 |
| | | | | 356/128 |
| 2004/0239307 A1* | 12/2004 | Bohnert | ............... | G01R 15/242 |
| | | | | 324/76.11 |
| 2005/0083566 A1 | 4/2005 | Zappettini et al. | | |
| 2009/0290165 A1* | 11/2009 | Bohnert | ............... | G01R 15/242 |
| | | | | 356/483 |
| 2013/0093410 A1* | 4/2013 | Eriksson | .............. | G01R 15/242 |
| | | | | 324/96 |
| 2017/0140710 A1* | 5/2017 | Miller | ................... | G09G 3/3413 |
| 2017/0160314 A1* | 6/2017 | Furukawa | .............. | G01R 19/00 |
| 2018/0059144 A1* | 3/2018 | Davis | ................... | G01R 15/247 |

OTHER PUBLICATIONS

International Search Report for PCT/US17/47330, dated Aug. 17, 2017, pp. 1-11.

\* cited by examiner $$r_{ki} = \begin{bmatrix} 0 & 0 & 0 & 0 & r_{43} & -r_{22} \\ -r_{22} & r_{22} & 0 & r_{42} & 0 & 0 \\ r_{13} & r_{13} & r_{33} & 0 & 0 & 0 \end{bmatrix}$$

FIG. 5

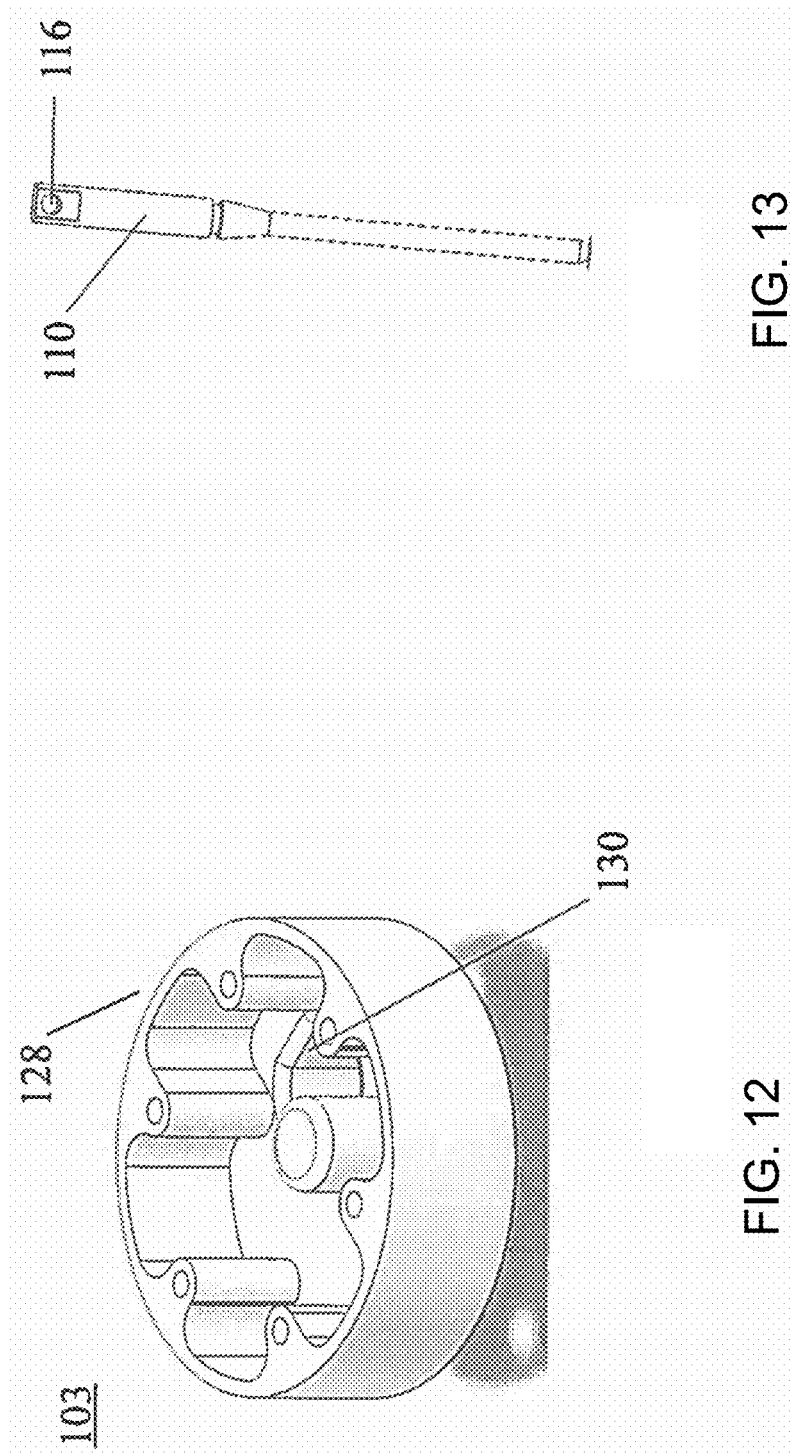

OPTICAL POCKELS VOLTAGE SENSOR ASSEMBLY DEVICE AND METHODS OF USE THEREOF

This application claims the benefit of U.S. Provisional Patent Applications Ser. No. 62/376,147, filed Aug. 17, 2016; Ser. No. 62/450,784, filed Jan. 26, 2017; and Ser. No. 62/468,091, filed Mar. 7, 2017 which are hereby incorporated by reference in their entirety.

FIELD

The present technology relates to the field of voltage sensors, and more particularly to optical voltage sensor assembly devices utilizing the Pockels effect to measure voltage, systems including the optical voltage sensor assembly devices, and methods of use thereof.

BACKGROUND

In recent years, there has been an acute need and demand for highly accurate voltage sensors in the electrical power distribution industry. This includes applications in the power grid network, as well those for electrical substations, transformers, switchgear, and relay monitoring.

Historically, measurement of medium voltage at distribution substations has been accomplished using iron-core ferro-magnetic voltage transformers. For instance, technologies such as Rogawski coils (RC), current transformer and power transformer (CT & PT) coils, and inductive voltage dividers have been used for voltage measurement. Such technologies, however, inherently disturb the Electromagnetic Field (EMF) associated with medium voltage transmission measurement. At best, such electromagnetic methods of measurement actively interfere with the voltage to be determined, thereby compromising the measurement of voltage indirectly. These conventional counterparts also have associated risks and danger due to arcing, flash, magnetic saturation, explosions, and catastrophic failure.

Given the challenges inherent to electromagnetic voltage measurement technology, optical sensors have been proposed for medium and high-voltage environments. Such sensors are immune to electromagnetic and radio frequency interference, with no inductive coupling or galvanic connection between the sensor head on high-voltage lines and power transmission substation electronics. The wide bandwidth of optical sensors provides for fast fault and transient detection and power quality monitoring and protection. Optical sensors can be easily installed on, or integrated into, existing substation infrastructure and equipment such as circuit breakers, insulators, or bushings resulting in significant space saving and reduced installation costs with no environmental impact.

Additionally, with the implementation of a Smart Grid and Smart Buildings, there has also been an acute need and demand for new voltage monitors, switch gear, and circuit breakers that can deliver real-time voltage information on low voltage circuits (i.e., <1 kV).

Intelligent switch gear and intelligent circuit breakers will be the key to fully leveraging the Internet of Things (IoT) in managing energy usage both on the grid and within buildings. Conventional circuit breakers function by "tripping," or shutting off, when voltage or current exceed an upper threshold. The tripping is sufficient for protecting downstream circuitry, machinery, and electronics, but offers no additional control. Intelligent switch gear or circuit breakers, on the other hand, would be able to do significantly more than this simple protection function.

By monitoring voltage, current, volt-ampere reactive (VAR), and total power, intelligent switch gear or circuit breakers can be used to ensure optimal delivery of energy to end-users on the distribution grid. Beyond the grid, intelligent monitoring technology would have broader applications in smart, energy efficient buildings, including office, retail, and industrial buildings, and in transportation systems, including electrical vehicle (EV) charging stations, rail networks, and transportation vehicles.

One key challenge faced by electricity distributors is delivering minimum voltage to all end users. For example, in the United States, distributors are required to deliver 120 volts±5% at 60 Hz to residential users. Thus, residential users must receive between 126 and 114 volts, this being termed "utilization voltage." Given the way distribution systems are structured, there are drops in this distribution service voltage based on distance between the distribution transformer and the end user. Therefore, in the residential scenario, a first user closer to the distribution transformer may receive 125 volts, whereas a second user further from that same distribution transformer receives only 115 volts. In this scenario, it is crucial that the second user located further from the distribution transformer receives at least 114 volts. While the scenario presented here is for residential users in the United States, it is similar for other end users, or power users, outside of the United States, where distribution service voltages are often higher than 120 V (e.g., 208 V, 240 V).

An important emerging principle in energy management is conservation voltage reduction (CVR). The concept behind CVR is that the distribution transformers provide the minimal voltage possible such that all users on a distribution line receive at least the minimum distribution service voltage (e.g., 114 V for U.S. residential users). Thus, rather than delivering the maximum 126 V to the first residential users on a distribution line to ensure all receive at least 114 V, with CVR distribution service voltage is monitored at all users such that distribution service voltage can be minimized. Doing so allows for optimal grid utilization and one study suggests that for each 1% reduction in distribution service voltage, mean energy consumption is reduced by 0.8%. Thus, optical voltage sensors could also be employed in low voltage applications.

A number of optical voltage sensors that utilize the Pockels effect have been described. For example, U.S. Pat. Nos. 5,731,579; 5,939,711; and 6,492,800, describe Pockels effect-based voltage sensors that include a polarizer at the input and a beam splitter at the output. Devices described by these patents have been deployed by a number of utilities and found to function well at constant temperature. However, when exposed to significant temperature, humidity, and environmental weather swings, these devices were no longer able to accurately monitor voltage.

A major issue in the reliability of optical voltage sensors is the environmental stability, particularly sensitivity due to temperature and humidity of the environment surrounding the optical system or assembly. In previous embodiments of the optical voltage sensors, elaborate polarization diversity schemes have been proposed and utilized that involve various optical components dedicated to polarization manipulation of phase and rotation. However, such polarization components, such as waveplates, retarders, and beam splitters are fragile and can vary greatly over temperature and environmental conditions and change the phase of the optical beam and resultant signal.

Recently, Sima, et al. (2016), "Temperature Characteristics of Pockels Electro-Optic Voltage Sensor With Double Crystal Compensation," AIP Advances 6, 055109 (2016) described an electro-optic voltage sensor comprised of double, or stacked, LiNbO$_3$ crystals with a complex air spaced polarization diversity scheme. This electro-optic voltage sensor had improved stability from 0° C. to 50° C., however, even this sensor did not meet the temperature stability requirements necessary for monitoring medium and high voltage transmission lines, which require stability from −40° C. to +80° C. Thus, there is a need in the art for a next generation optical voltage sensor, capable of maintaining accurate readings over temperatures ranging from −40° C. to +80° C.

Another key challenge encountered with optical voltage sensor occurs when optical voltage sensors are used in underground or enclosed situations where they may be exposed to flooding or other sources of moisture. In such situations, the standard materials used in optical voltage sensors may be subjected to corrosion, which adversely affects sensor performance and longevity.

The present invention is directed to overcoming these and other deficiencies in the art.

SUMMARY

One aspect of the present technology relates to an optical voltage sensor assembly. The optical voltage sensor assembly includes an input fiber-optic collimator positioned and configured to collimate input light beam from a light source. A crystal material is positioned to receive the input light beam from the light source and configured to exhibit the Pockels effect when an electric field is applied through the crystal material. An output fiber-optic collimator is positioned to receive an output light beam from the crystal material and configured to focus the output light beam from the crystal onto a detector.

Another aspect of the present technology relates to a modular switchgear elbow optical voltage sensor device. The modular switchgear elbow optical voltage sensor device includes a sensor body having a first end and a second end. The second end includes a sensor cavity configured to house an optical sensor crystal and a cable cavity configured to house one or more fiber optic cables. An internal pickoff rod is located in the first end of the sensor body. An external pick-off rod is connected to the internal pickoff rod at a pickoff rod connection point within the sensor body, such that the external pickoff rod and the internal pickoff rod form substantially a right angle. A base cap is configured to be attached to the sensor body. The base cap includes a fiber optic cable strain relief to allow one or more fiber optic cables to pass from the sensor body, through the base cap, and external to the modular switchgear elbow optical voltage sensor device.

The present technology advantageously provides an all-optical voltage sensor with minimal to no metallic or ferrous parts that utilizes a totally passive optical sensing function of the EMF. The present technology offers several substantial advantages over traditional technologies for medium (i.e., 1.0 to 46 kVolts) and high voltage (i.e., greater than 46 kVolts) power distribution network measurements. Examples of the technology may also be utilized in low voltage applications (i.e., less than 1.0 kVolts).

The technology described relates to an all-optical sensor for detecting and measuring voltage or applied electric field. The voltage imprints polarized light travelling through a crystal or optical material with an optical phase difference due to projections of the polarization vector along the principal axes of the crystal's index ellipsoid via the Pockels effect. The phase difference is detected by linearly polarizing the input light to the crystal, using an entrance linear polarizer, and analyzing the output light from the crystal through an exit linear polarizer (also referred to as an analyzer) that is oriented with non-zero projections along at least two of the principal axes of the index ellipsoid having different indices of refraction or relative optical phase. Any change or oscillation of the applied electric field or voltage across the crystal, therefore, is detected as a modulation of the intensity of light exiting the analyzer. By measuring the modulation of this light, the voltage across the crystal, or electric field, can be deduced.

A sensor of the present technology that embodies these advantageous features utilizes the Pockels effect, wherein the dielectric permittivity of a material is changed in first order due to the application of an electric field. A key challenge with optical voltage sensors based on the Pockels effect is maintaining accurate readings over a range of temperatures and environmental conditions, on high voltage transmission lines. Such transmission lines, due to their location outdoors, are exposed to large swings in temperature and humidity, along with other environmental conditions. Because of this, it is important that sensors developed for measuring voltage on medium to high voltage transmission lines are stable over temperatures ranging from −40° C. to +80° C.

The present technology describes the use of an optical system and method, in which, without loss of generality, a Pockels effect crystal or material is the active medium for sensing the electric field. Equivalently, the voltage drop across the crystal can be obtained, and precisely measured, since the voltage is simply the electric field integrated through the crystal. The method to measure the voltage, or equivalently the electric field, of the present technology includes a method for converting optical phase due to the Pockels effect into an intensity modulated signal. This method is simple and robust in comparison to all other proposed polarization methods and diversity schemes, or more elaborate interferometric methods of analyses.

Examples of this technology provide a completely passive measurement of voltage and current (no electronics at the point of measurement) with high reliability and long operational life. Another noted feature is that signals are transmitted by fiber optics that support long distance transmission allowing for the service at the base of the power pole with only a hot-stick for install. This is in contrast to traditional electrically based technology where performance can be compromised due to interference and electrical crosstalk. Additionally, the all-optical format of the present technology does not require any additional power taps from the natural transmission line, and is independent of the electrical or transmission infrastructure with solar or battery power only necessary for the processing electronics that can be situated remotely at the base of the transmission line tower or power pole or even further.

In order to minimize or substantially eliminate effects on the optical signal due to temperature, humidity, and moisture ingress, the present technology provides an integrated robust design, with all optical components bonded together with no airspaces. Examples in this technology advantageously do not utilize any optical polarization elements, such as waveplates, retarders, and beam splitters, and instead relies on a simple polarizer and analyzer paradigm integrated into the optical assembly to provide a truly robust optical voltage sensor system and assembly.

In one example, the present technology provides a modular all-optical sensor, for detecting and measuring voltage or applied electric field specifically adapted for use in switchgear, wherein it is likely to be exposed to flooding or high moisture situations. The modularity of the system allows for it to be easily adapted for use in all elbow configurations and T-configurations available for load break and dead break products. Thus, the modular all-optical sensor of the present technology provides a one-size fits all solution for use with switchgear and voltage monitoring in ground-based and underground applications, which may be subject to adverse conditions such as flooding or high moisture environments.

BRIEF DESCRIPTION OF THE DRAWINGS

FIG. 5 is the reduced, contracted matrix of electro-optic Pockels coefficients and elements for symmetry reduced Lithium Niobate (point group symmetry 3 m).

FIG. 12 shows an exemplary design for the base cap of the modular optical voltage sensor device as shown in FIG. 9.

FIG. 13 shows a custom pick-off rod with threaded mounting that provides a solid assembly point for use with the elbow of the modular optical voltage sensor device as shown in FIG. 9.

FIG. 14A is an electric field sensor, whereas FIG. 14B is a direct contact sensor.

FIG. 15A shows a side view of the internal components in an exemplary configuration. FIG. 15B shows a cutout side view of an encased embodiment.

DETAILED DESCRIPTION

The present technology relates to the field of voltage sensors, and more particularly to optical voltage sensor assembly devices utilizing the Pockels effect to measure voltage, systems including the optical voltage sensor assembly devices, and methods of use thereof.

One aspect of the present technology relates to an optical voltage sensor assembly. The optical voltage sensor assembly includes an input fiber-optic collimator positioned and configured to collimate input light beam from a light source. A crystal material is positioned to receive the input light beam from the light source and configured to exhibit the Pockels effect when an electric field is applied through the crystal material. An output fiber-optic collimator is positioned to receive an output light beam from the crystal material and configured to focus the output light beam from the crystal onto a detector.

Figure 1:
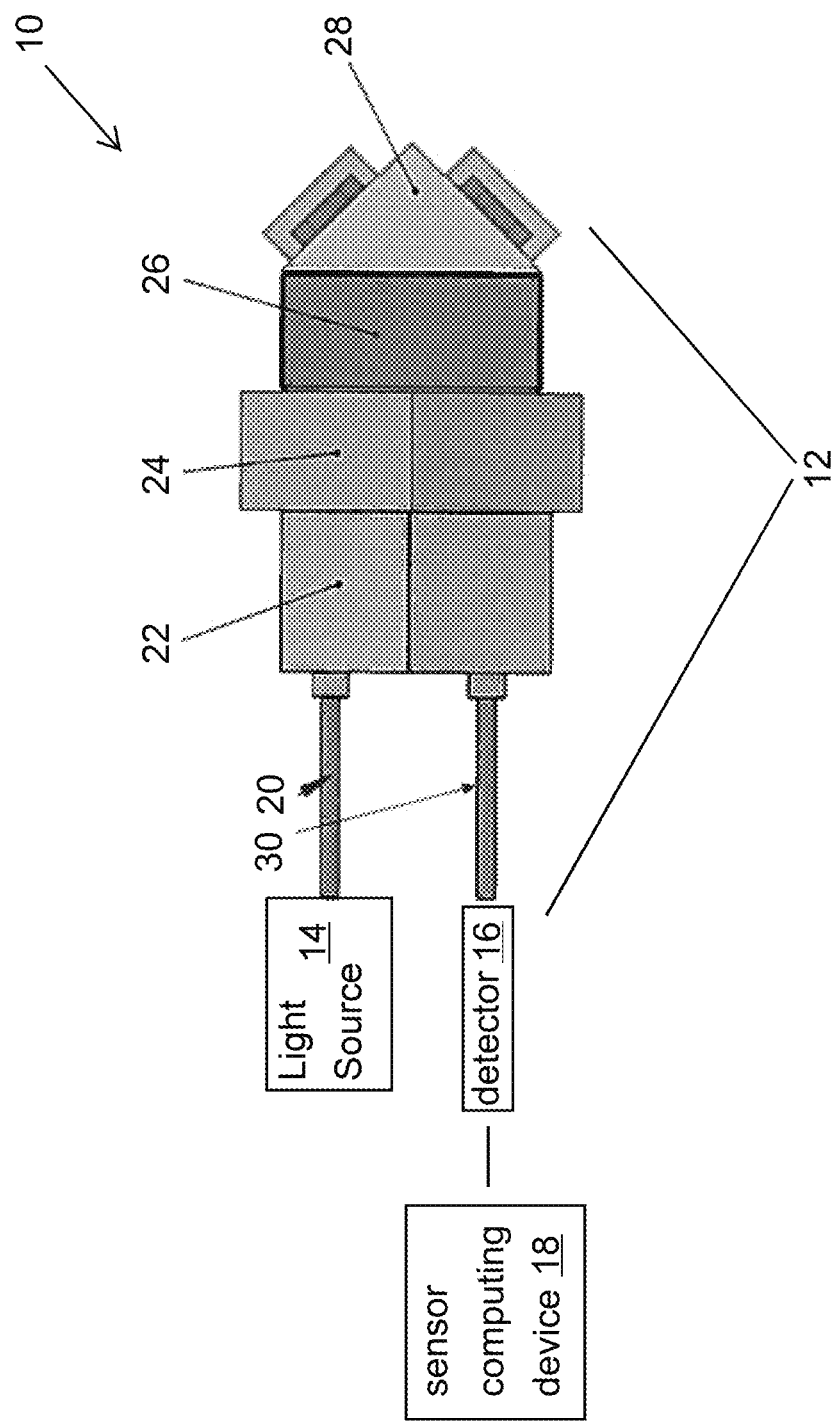
FIG. 1 is a partial schematic and partial block diagram of an exemplary system including an exemplary optical voltage sensor assembly of the present technology.

FIG. 1 is a partial schematic and partial block diagram of an exemplary system 10 including an exemplary optical voltage sensor assembly 12 of the present technology. The system 10 includes the optical voltage sensor assembly 12 coupled to a light source 14, a detector 16, and a sensor computing device 18. The system 10 may also include other types and numbers of elements, components, or devices in other configurations, including additional optics, such as lenses, prisms, or filters, or electronics, such as additional amplifiers, AC to DC converters, or transducers, by way of example only. Additional optics may be utilized, by way of example, to redirect, focus, collimate, or filter the wavelength of light with the system. Additional electronics may be utilized, by way of example, to condition the signal from the detector 16 to facilitate further processing.

The optical voltage sensor assembly 12 includes an input collimator 20, a collimator block housing 22, a spacer block 24, a crystal material 26, and a retro-prism sub-assembly 28, although the optical voltage sensor assembly 12 may include other types and/or numbers of additional components or elements in other configurations, such as a temperature sensor or probe as described below.

The optical voltage sensor assembly 12 provides an electro-optic voltage sensor utilizing the Pockels effect in the crystal material 26 within an applied electric field or across which there is a voltage drop. The Pockels effect is observed as an intensity modulation of light due to the relative optical phase of polarized light between projections along principal axes of the index ellipsoid of the Pockels active crystal material 26. A differential phase shift is imprinted on the polarized light propagating through the crystal material 26 that is linearly proportional to the magnitude of the electric field applied or the voltage drop across the crystal material 26. The optical phase is detected as only a direct intensity modulation of polarized light exiting the non-linear optical crystal material 26 through an analyzing polarizer. The intensity modulation of light is generated using a compact, robust, temperature and environmentally stable arrangement of a polarizer and analyzer system within the optical voltage sensor assembly 12.

Figure 2:
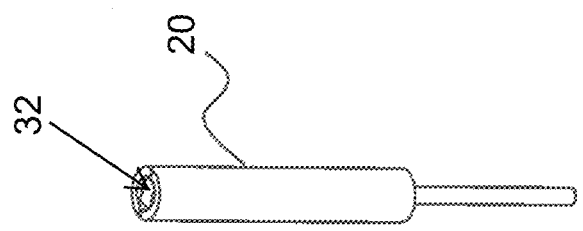
FIG. 2 is a perspective view of an exemplary collimator with a polarizer in front of its clear aperture that may be employed with the optical voltage sensor assembly illustrated in FIG. 1.

The input collimator 20 of the optical voltage sensor assembly 12 is coupled to the light source 14, such that the light source 14 provides an incoherent, coherent, or partially coherent light beam to the input collimator 20 as described below. In one example, the input collimator 20 is coupled to the light source through a fiber optic cable that allows the light source 14 to be located remotely from the optical components of the optical voltage sensor assembly 12. An input polarizer or analyzer may be embedded within, bonded to, or attached to the input collimator 20. By way of example, FIG. 2 shows an exemplary input collimator 20 with a polarizer 32 in front of its clear aperture that may be employed with the optical voltage sensor assembly 12. In one example, the polarizer 32 is a linear polarizer having a thickness of less than about 1.0 mm.

The input linear polarizer 32 is embedded and bonded, contacted, adhered, epoxied, glued, attached, or otherwise integrated in the input collimator 20, although the input linear polarizer 32 may also be located in the collimator block housing 22 in the same manner. In one example, the input linear polarizer 32 is positioned and configured so that the linearly polarized light output from the input linear polarizer 32 propagates along one of the principal axes of an index ellipsoid of the crystal material 26 or along a linear combination of the principal axes of the index ellipsoid of the crystal material 26, by way of example. The input linear polarizer 32 may further be positioned and configured so that the linearly polarized light output from the input linear polarizer 32 has a polarization vector of light having a non-zero projection. By way of example, the polarization vector of light may be between about 22.5 degrees and about 67.5 degrees, with at least two principal axes of the modified index ellipsoid of the crystal material 26 in the presence of an external applied electric field, such that the difference in the indices of the two principal axes is non-zero and contains a Pockels optical phase term that is proportional to the applied electric field or voltage drop across the crystal material.

The integration of the polarizer 32 into the input collimator 20 and incorporation of the light polarization and analyzing components into an integrated solution with surface to surface attachment of all elements provides a robust and stable assembly over temperature. The assembly is also impervious to humidity or moisture and other degrading environmental conditions. Alternatively, the polarizer 32 may be incorporated into the collimator block housing 22.

Figure 3:
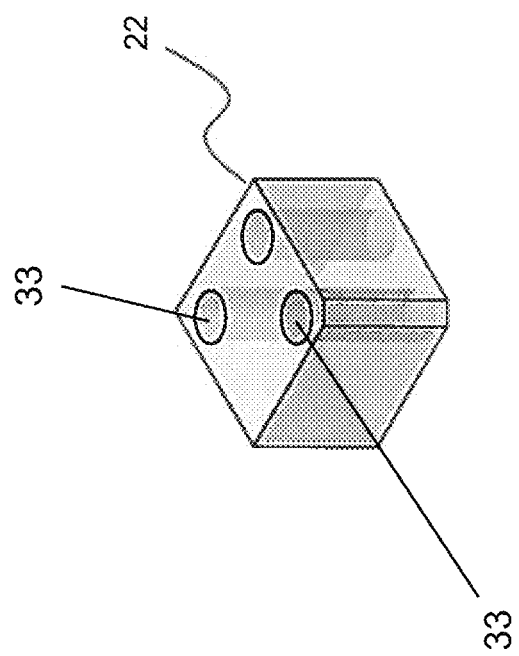
FIG. 3 is a side perspective view of an exemplary glass collimator block with cylindrical bore holes for insertion of the collimators that may be employed with the optical voltage sensor assembly illustrated in FIG. 1.

The collimator block housing 22 is configured to provide a housing for insertion of the input collimator 20 and the output collimator 30, although the collimator block housing 22 may house other elements, such as a polarizing element by way of example. As illustrated in FIG. 3, a glass or ceramic block may be used for the collimator block housing 22 to hold the input collimator 20 and the output collimator 30. The collimator block housing 22 includes bore holes 33 for securely receiving the input collimator 20 and the output collimator 30 therein. In one example, the input collimator 20 and the output collimator 30 are inserted and embedded, bonded, adhered, contacted, or attached in, or to the collimator block housing 22.

In one example, the collimator block housing 22 provides a thermal expansion coefficient similar to the glass material of the input collimator 20 and the output collimator 30 and any associated polarizers, such as the polarizer 32 shown in FIG. 2 by way of example only. This provides for pointing stability for the light beam delivered from the light source 14 in its path traversing the optical voltage sensor assembly 12 and through the crystal material 26, thereby reducing phase variations that can distort the modulated light intensity.

The collimator block housing 22 provides precise and stable opto-mechanical placement of the input collimator 20 and the output collimator 30, so as to ensure beam pointing stability and accuracy. The input collimator 20 and the output collimator 30 are embedded into the collimator block housing 22, which is subsequently attached or bonded to the spacer block 24 of the optical voltage sensor assembly 12, to attain successful beam propagation and fiber coupling from the input collimator 20 to the output collimator 30. The present technology provides for such a robust placement by inserting and bonding the input collimator 20 and the output collimator 30 into the collimator block housing 22 that is then bonded to the spacer block 24 of the optical voltage sensor assembly 12.

The spacer block 24 is coupled to the collimator block housing by way of example through an optical adhesive bonding, although other attachment mechanisms may be employed. In one example, the spacer block 24 is constructed of glass and located between the collimator block housing 22 and the Pockels crystal material 26 provides for a uniform and homogeneous optical interface, reducing thermal mismatch between the crystal material 26 and the glass materials. The surfaces of the glass spacer block 24 are flat with minimal curvature and low surface roughness in order to provide optimal surfaces for bonding the collimator block housing 22 assembly with the crystal material 26 through the spacer block 24, thereby integrating the optical voltage sensor assembly 12. Bonding the components to the glass spacer block 24 minimizes fluctuations due to thermal variation of intrinsic birefringence in the optical voltage sensor assembly 12.

The crystal material 26 is coupled to the spacer block 24 by way of example through an optical adhesive bonding. The crystal material 26 provides a Pockels crystal cell that exhibits strong optical phase modulation under electric field excitation, which requires careful design and fabrication. The requirements for the Pockels cell crystal material 26 are high electro-optic coefficients (pm/V) and a geometrical configuration such that the optical phase accumulates as a linear function of the optical path length. This would suggest a transverse modulator configuration for the Pockels cell crystal material 26 as opposed to a longitudinal configuration that is independent of length. This requires that the Pockels cell crystal material 26 be non-centrosymmetric. The crystal material 26 may be selected from one of crystal point group symmetry 3 m, $\overline{42}$ m, $\overline{43}$ m, m3 m, 4 mm, 2 mm, 23, or ∞.

Figure 4:
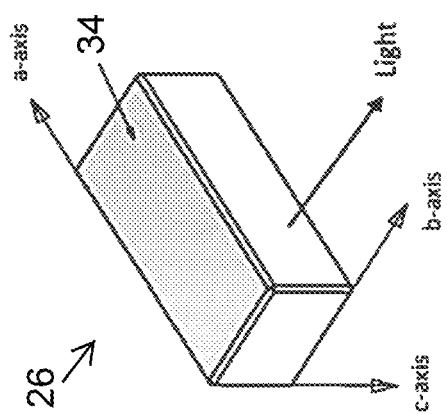
FIG. 4 is an exemplary Lithium Niobate crystal with the indicated direction of propagation of light along the b-axis, the plane of polarization of light being defined by the a- and c-axes, and an applied electric field along the c-axis.

A number of materials may be used for the crystal cell material 26, including but not limited to $C_6H_5O_2N$, $Pb_{0.814}La_{0.124}(Ti_{0.6}Zr_{0.4})O_3$ (PLZT), β-Zns, ZnSe, ZnTe, $Bi_{12}SiO_{20}$, $Ba_{0.25}Sr_{0.75}Nb_2O_6$, $KTa_{0.35}Sr_{0.75}Nb_{0.65}O_3$, $CsH_2AsO_4$, $NH_4H_2PO_4$, $NH_4D_2PO_4$, $KD_2PO_4$, $KH_2PO_4$, Lithium Niobate ($LiNbO_3$), $LiTaO_3$, $BaTiO_3$ $SrTiO_3$, $Ag_3AsS_3$, $KNbO_3$, electro-optic polymers and other materials. In one example, crystalline lithium niobate ($LiNbO_3$) is the choice Pockels crystal material 26 due to its low conductivity and the fact that under an electric field, charge carriers migrate to the crystal boundaries. The Pockels effect response could therefore also be enhanced with metallic coatings. FIG. 4 illustrates an exemplary Lithium Niobate crystal that may be utilized for the crystal material 26. The propagation of light from the light source 14 is along the b-axis, the plane of polarization being defined by the a and c axes, and the applied electric field along the c-axis. Designated surfaces 34 can be metallized in order to enhance and make uniform the electric field across the crystal material 26.

As is well known to practitioners in the art, the Pockel's effect is the first order response of the impermeability (the inverse of the relative permittivity) of a material to an electric field. The Pockels effect is generally described as a tensor that satisfies symmetry conditions and is non-vanishing only for non-centrosymmetric crystals. The Pockels effect tensor coefficients can be represented in a reduced contracted form as a 6×3=18 matrix set of values. In the presence of an applied electric field E, the index ellipsoid, in a Pockels effect material, is by definition:

$$\sum_{i=1}^{3}\left[\frac{x_i^2}{n_i}+\sum_{j=1}^{3}\sum_{k=1}^{6}r_{ki}E_ix_ix_j\right]=1 \quad (1)$$

Where $n_i$, is the refractive index along coordinate axis $x_i$ at zero electric field, $r_{ki}$ is the contracted Pockels coefficient and $E_i$ is the component of electric field along the $x_i$ axis. Therefore, in the presence of an external applied electric field, the index ellipsoid will in general be modified, distorted, and rotated from that of the original index ellipsoid of the material in absence of the electric field as denoted by the first three terms of equation (1). Under a suitable principal-axis coordinate transformation, the index ellipsoid can be transformed to the standard form:

$$\frac{x_{t,1}^2}{n_{t,1}^2}+\frac{x_{t,2}^2}{n_{t,2}^2}+\frac{x_{t,3}^2}{n_{t,3}^2}=1 \quad (2)$$

Where, now, the transformed indices (subscript t) are general functions of the standard indices in the absence of an electric field, the Pockels coefficients $r_{ki}$, and the electric field components, that is $$n_{t,i}=n_{t,i}(n_i,r_{ki},E_k) \quad (3)$$

Light traveling through the crystal material 26 will accumulate optical phase, in a complex manner, according to the projection of the polarization vector along the principal axes of the index ellipsoid after application of the electric field.

A non-limiting example configuration that may be used for the crystal material 26, which is readily available, is the Z-cut form which is of trigonal 3 m (C3v) crystal symmetry, according to Hermann-Manguin crystal notation, and which like all Pockels effect crystals is non-centrosymmetric (lacking a center of inversion symmetry). For congruent Lithium Niobate, the principal axis symmetry reduced electro-optic Pockels tensor elements has eight non-vanishing components with only four unique values. For a transverse modulator configuration, with light propagating along the c-axis, and E-field along the b-axis, only two of the five non-zero Pockels tensor elements are relevant in the transformed principal axis index ellipsoid, namely, $r_{13}$ and $r_{33}$. The index ellipsoid relation, characterized by the ordinary ($n_o$) and extraordinary ($n_e$) refractive indices, is distorted by the Pockels terms as:

$$\frac{1}{n_0^2}(a^2+b^2)+\frac{c^2}{n_e^2}=1-r_{13}E(a^2+b^2)+-r_{33}Ec^2 \quad (4)$$

In this case, the optical phase of a polarized plane wave (b-axis) due to an integrated E-field or equivalent voltage drop across the width (d) of the crystal material 26 and propagation through the crystal material 26 (L) is given as:

$$\Gamma=\frac{2\pi}{\lambda}(n_e-n_0)L-\frac{\pi}{\lambda}(n_e^3r_{33}-n_0^3r_{13})\frac{L}{d}V \quad (5)$$

Where $\lambda$ is the wavelength of light, $n_e$, is the refractive index of the e-ray, $n_o$, is the refractive index of the o-ray, $r_{33}$ and $r_{13}$ are the electro-optic Pockels coefficients, L is the length of the crystal material 26 along the direction of propagation of light, d is the width of the crystal material 26 across which the voltage drop V(t) due to the external electric field applied. Note that we will refer to the first term due to pure birefringence ($\Phi_B$) and the second term as the Pockels term ($\Phi_P$). The Voltage drop V(t) is time dependent, for example, but not limited to Alternating Current (AC) voltage on power lines, so that a change or oscillation induces a modulation of the phase that is crucial to the methods and algorithms for determination of V(t) using the optical light. For a transverse modulator, the axes for the e-ray and o-ray are perpendicular to the optical propagation direction of light, so that the half wave voltage is given as:

$$V_\pi=\frac{d}{L}\frac{\lambda}{n_e^3r_{33}-n_0^3r_{13}} \quad (6)$$

and is determined by the crystal design. In this technology, it was convenient to choose d=4 mm, L=6 mm, although other values may be selected. Based on typical values of the electro-optic coefficients the calculated value of $V\pi$ is approximately 1250 volts in single pass (2500 Volts in double pass with L=12 mm).

A simple expression for the optical transmission through the optical voltage sensor assembly 12 and the crystal material 26 due to the Pockels phase can be represented as:

$$\frac{I(t)}{I_o}=\sin^2\left[\pi\frac{V(t)}{V_\pi}+\Phi\right] \quad (7)$$

Here $V(t)=V_m \sin(\omega t+\phi_{AC})$ is in this example, but not generally limited to, an AC voltage across the crystal, $\omega=2\pi\phi_{AC}$ is the angular frequency associated with 60 Hz AC line frequency, $\phi_{AC}$ is the AC line phase shift, and $\Phi$ is a total track length optical phase factor associated with the optical voltage sensor assembly 12 which can contain all the non-Pockels dependent phase factors. These include natural birefringence, pyroelectric, space charge effects, and thermal expansion of the crystal material 26.

Noting that the overall optical phase factor in equation 7 is temperature dependent and can be taken to be calibration factor C(T), and assuming $V_\pi$ is reasonably large compared to the voltage across the crystal material 26. The voltage can be solved for, generically from eqn. (7) as:

$$V(t,T)=\frac{V_\pi(T)}{\pi}\sqrt{\frac{Pac(t,T)}{Pdc}}-C(T) \quad (8)$$

where the temperature dependence of the term is explicitly indicated, and the optical beam intensities ($P_{ac}$, $P_{dc}$) are reinterpreted as optical AC modulated power on the photodiode and its DC component. The explicit inverse trigonometric term expression can be included in equation (8) to increase accuracy of the voltage drop calculation for larger values of $V_m$.

The retro-prism assembly 28 is coupled to the crystal material 26. The retro-prism assembly 28 is configured to receive light propagated through the crystal material 26 and reflect the propagated light beam twice back into the crystal material 26, although other configurations may be utilized. The retro-prism assembly 28 may have any configuration and made be constructed of any materials suitable to reflect the light beam twice back into the crystal material 26.

The output collimator 30 is positioned in the collimator block housing 22 to receive light directed by the retro-prism assembly back through the crystal material 26, the spacer block 24 and the collimator block housing 22. In one example, the output collimator 30 is coupled to the detector through a fiber optic cable that allows the detector 16 to be located remotely from the optical components of the optical voltage sensor assembly 12. The output collimator 30 is coupled to the detector 16 to provide the polarized light from the crystal material 26 based on the Pockels effect to the detector 16. An output polarizer or analyzer (in similarity to the input polarizer 32 shown in FIG. 2) can be embedded, bonded, or attached to the output collimator 30, through which the light is fiber-optically coupled as it exits the optical voltage sensor assembly 12. Alternatively, an output polarizer or analyzer can also be attached to other portions or components of the optical voltage sensor assembly 12 through which light passes after exiting the crystal material 26, such as the collimator block housing 22. In one example, the output linear polarizer is oriented with its polarizing axis along the direction of the light polarization vector that has non-zero projections on at least two principal axes of the index ellipsoid of the Pockels active crystal material 26 to induce a phase difference in the light field amplitude such that the exit light intensity is modulated or varies periodically.

Light source 14, in one example, may be any suitable laser diode that produces a temporally or spatially coherent, or partially coherent, light beam, such as a He Ne gas laser operating at a wavelength of approximately 632 nm. Alternatively, other laser diodes, operating at other wavelengths, such as 1310 or 1550 lasers, may be utilized. In another example, light source 14 may be a non-coherent source, such as a light emitting diode or superluminescent diode by way of example only, coupled with optics or filters to spectrally narrow the linewidth or spatially filter the emitted light beam.

The detector 16 is positioned to receive light beams reflected back through the crystal material 26 by the retro-prism assembly 28 through the output collimator 30. The detector 16 is configured to measure the optical phase of the product light beams from which the voltage of the applied field can be determined as described above. The detector 16 may be any suitable detector configured to measure the optical phase of the received light beam. The detector 16 may be coupled to additional electronics, such as an amplifier by way of example only, to prepare the signal from the detector 16, i.e., the measured optical phase of the product light beams, for further processing, although other electronics may be utilized to adjust the output signal.

Figure 6:
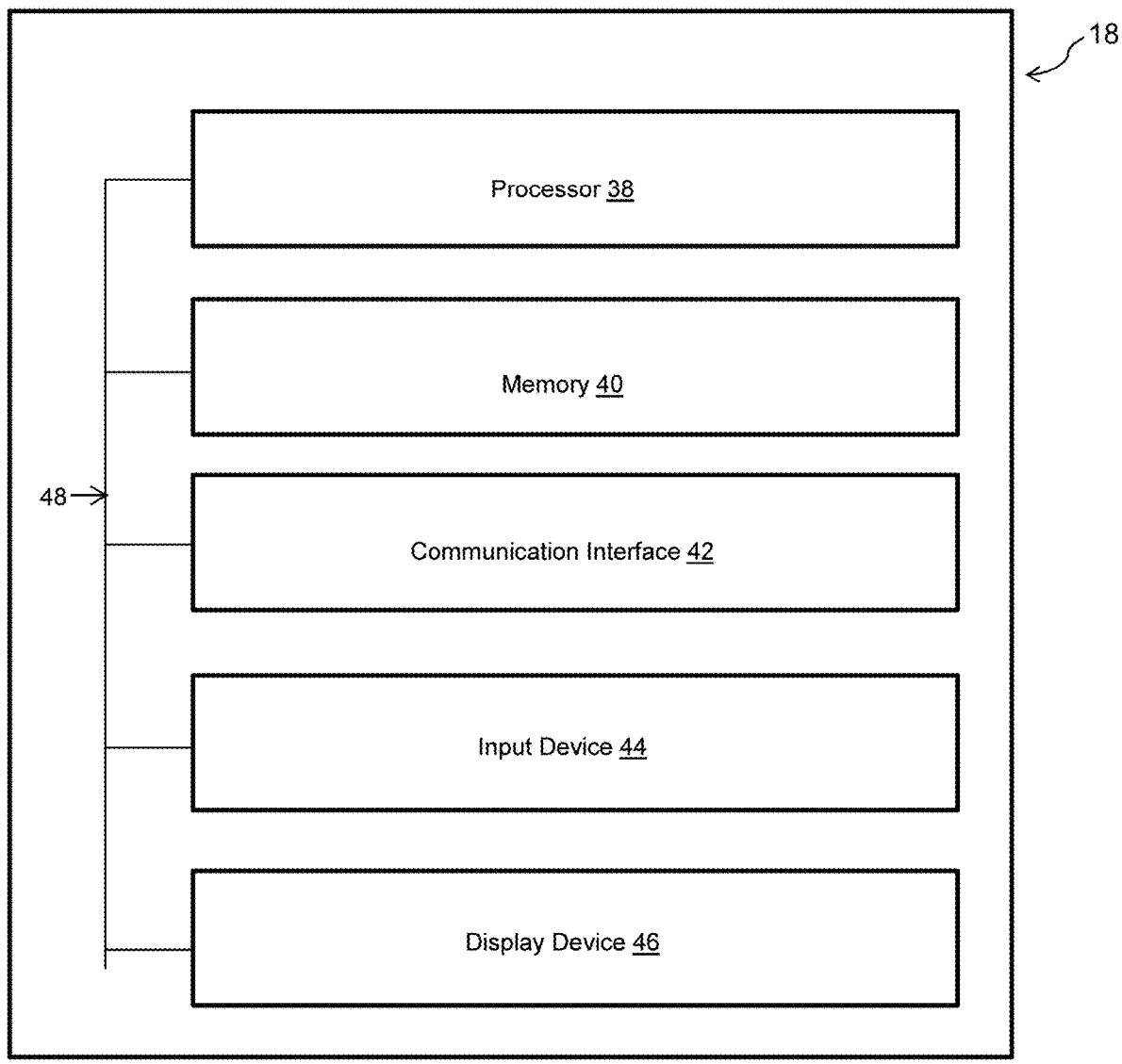
FIG. 6 is a block diagram of an exemplary sensor computing device for use in the system illustrated in FIG. 1.

The detector 16 is coupled to sensor computing device 18. Referring now more specifically to FIG. 6, sensor computing device 18 is configured to determine a voltage based on the optical phase of the light as measured by the detector 16 in accordance with the methods described herein. The sensor computing device 18 includes processor 38, memory 40, communication interface 42, input device 44, and display device 46, which are coupled together by bus 48 or other communication link, although other numbers and types of systems, devices, components, and elements in other configurations and locations can be used.

The processor 38 executes a program of instructions stored in the memory 40 for one or more aspects of the present technology. Other numbers and types of systems, devices, components, and elements in other configurations and locations can be used to execute the program of instructions stored in the memory 40.

The memory 40 stores these programmed instructions for one or more aspects of the present technology, although some or all of the programmed instructions could be stored and/or executed elsewhere. A variety of different types of memory storage devices, such as a random access memory (RAM), read only memory (ROM), hard disk, CD ROM, DVD ROM, or other computer readable medium which is read from and written to by a magnetic, optical, or other reading and writing system that is coupled to the processor 38, can be used for the memory 40.

The communication interface 42 is used to operatively couple and communicate between the sensor computing device 18 and one or more other computing devices via a communications network. Other types and numbers of communication networks or systems with other types and numbers of connections and configurations can be used for communication between the sensor computing device 18 and one or more other computing devices. By way of example only, the communications network could use TCP/IP over Ethernet and industry-standard protocols, including NFS, CIFS, SOAP, XML, LDAP, and SNMP. Other types and numbers of communication networks, such as a direct connection, a local area network, a wide area network, modems and phone lines, e-mail, and wireless communication technology, each having their own communications protocols, can be used by the communication networks.

The input device 44 and the display device 46 of the sensor computing device 18 enable a user to interact with the sensor computing device 18, such as to input and/or view data and/or to configure, program, and/or operate the sensor computing device 18, by way of example only. The input device 44 may include a keyboard, computer mouse, and/or touch screen, and the display device 46 may include a computer monitor. Other types and numbers of input devices and/or display devices could also be used in other examples.

An exemplary operation of the system including the optical voltage sensor assembly 12 will now be described. Light from an incoherent, coherent, or partially coherent light source 14 is delivered by the input fiber collimator 12, which is inserted into the collimator block housing 22. In one example, referring to FIG. 2, the light travels through the polarizer 32 before being introduced into the spacer block 24 and into the crystal material 26. The beam of light is thus linearly polarized before entering the crystal material 26 along the direction of the crystal optic axis (b-axis) as shown in FIG. 4. The polarization state has a non-zero projection with the a-axis and c-axis, and ideally for the case of Lithium Niobate is at 45 degrees with respect to the these axes.

The polarized light beam is reflected twice by the specially designed retro-prism assembly 28, and re-enters the crystal material 26 again. Based on the Pockels effect, with an electrical field applied to the crystal material 26, an optical phase is imparted to the light, which is then, in general, elliptically polarized. Upon exiting the crystal material 26, the light with imparted optical phase is incident on the output polarizer, or analyzer, which may be located in the output collimator 30 or within the collimator block housing 22.

The orientation of the analyzer ideally is coincident with the polarization vector of the light producing maximum modulation of light associated with the time dependent electric field applied across the crystal material 26. For Lithium Niobate in a transverse modulator configuration (equation 8, supra), this corresponds to the semi-major axis of the outgoing elliptically polarized light. The detector 16 measures the imparted optical phase. The sensor computing device 18 then computes a voltage based on the optical phase measured by the detector.

Figure 7:
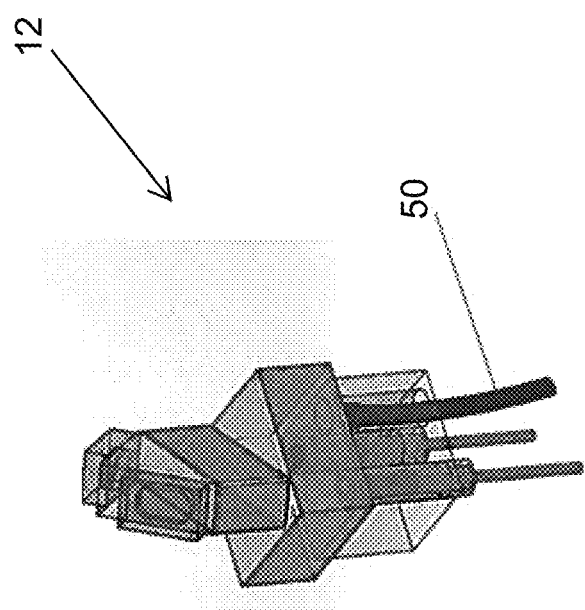
FIG. 7 is another exemplary optical voltage sensor assembly including an embedded fiber optic temperature sensor probe inserted into one of the holes of the collimator block of the optical voltage sensor assembly shown in FIG. 1.

FIG. 7 is a perspective view of the exemplary optical voltage sensor assembly 12 illustrated in FIG. 1 with an embedded temperature sensor 50 or probe. The structure and operation of the optical voltage sensor assembly 12 in this example is the same as discussed with respect to FIG. 1 except as described below.

It is noted that light traversing through the crystal material 26 with a responsive Pockels effect experiences a phase modulation in the presence of an electric field or voltage difference across the dimensions of the crystal material 26. For the Pockels effect optical voltage sensor assembly 12, the magnitude and intensity of the phase modulation is affected by the temperature of the material through the dependence of the refractive indices and electro-optic Pockels tensor coefficients on temperature. In addition, the Pockels effect may be combined or masked by the effects of temperature on birefringence that also affects the phase of the light beam. In order to determine the strength of an externally applied electric field or voltage, these temperature effects must be considered and measured, and a calibration and/or compensation procedure that corrects for temperature variation must be formulated and applied for the Pockels effect optical voltage sensor assembly 12. This issue is not adequately addressed by the current state of the art and can be problematic for achieving accurate and repeatable determinations of voltage measurements using Pockels effect sensors, such as optical voltage sensor assembly 12.

Referring now to FIG. 7, in one example, the optical voltage sensor assembly 12 includes a temperature sensor 50. The temperature sensor 50 can be attached, embedded, or otherwise coupled to the Pockels effect crystal material 26. Alternatively, the temperature sensor 50 can be attached, embedded, or otherwise coupled to an optical assembly housing the Pockels effect crystal material 26. In yet another example, the temperature sensor 50 is located in proximity to, or within the ambient environment of, the Pockels effect optical voltage sensor assembly 12.

By way of example only, the temperature sensor 50, or probe, can be an electrical, optical, or mechanical temperature sensor. Without loss of generality, examples of temperature sensors or probes that may be utilized with the present technology include optical temperature sensors, such as by way of example only a GaAs bandgap fiber-optic temperature sensor, fluorescence fiber-optic temperature sensors, electrical temperature sensors such as thermocouples or thermistors, or temperature dependent driven mechanical flexures or MEMs temperature sensors, although other types of temperature sensors that could be used with Pockels effect optical voltage sensor assembly 12 for the purposes of temperature compensation or calibration. The temperature sensor 50 may be communicatively coupled to the sensor computing device 18 to provide temperature readings that may be used to provide temperature based calibration of the voltage measurements determined in the methods described above.

Figure 8:
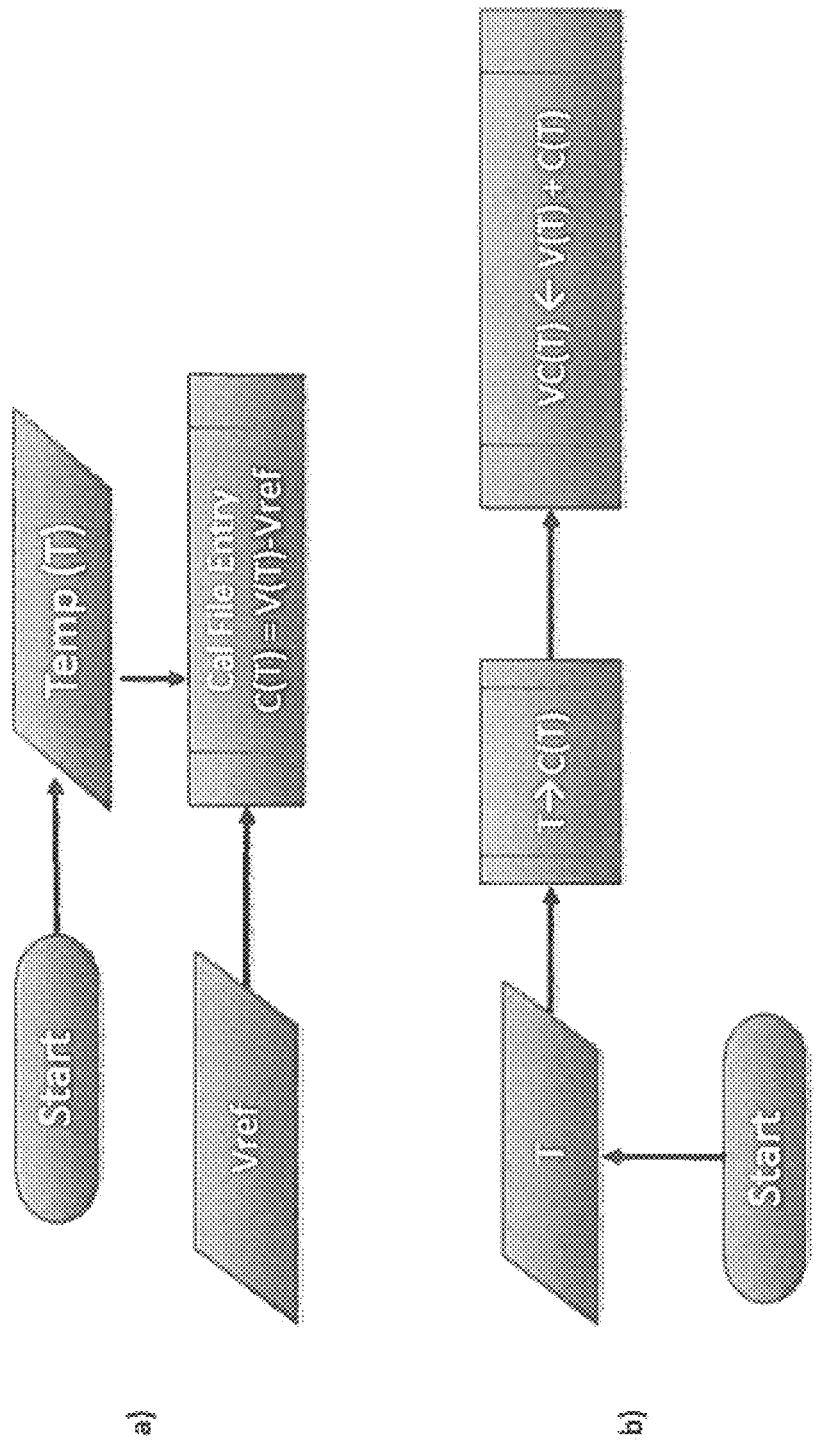
FIG. 8 shows a method to construct a calibration file and utilize the data in the file to compensate voltage measurements.
Figure 9:
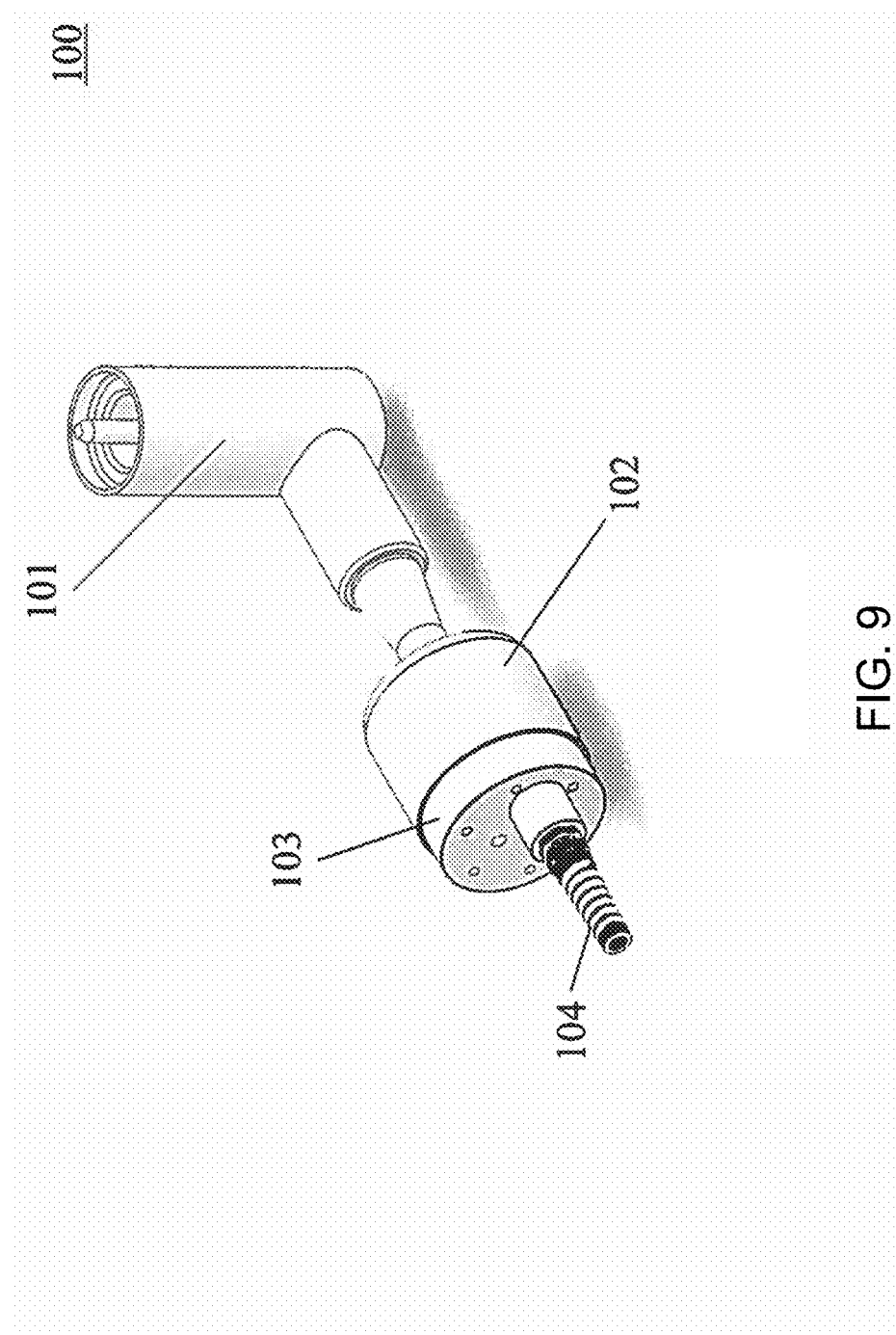
FIG. 9 is a perspective view of a modular optical voltage sensor device for use with the optical voltage assembly of the present technology for use with switchgear elbows.

FIGS. 8A and 8B illustrate an exemplary method or algorithm for compiling and computing an additive calibration factor based on measurement at controlled temperatures using the temperature sensor 50. As shown in FIG. 8A, a calibration factor C(T) is computed at a number of controlled temperatures T from the measured value of the voltage potential V(T) over the optical voltage sensor with respect to an applied known voltage reference Vref. The calibration factor may subsequently be used for correcting or improving the accuracy or precision of a voltage measurement V(T) by the optical voltage sensor assembly during operation at an arbitrary measured temperature T, as in FIG. 8B. As shown in FIG. 8B, the voltage calibration C(T), factor is applied, via functional interpolation, or a lookup or indexed table of values, to the measured voltage V(T) resulting in a corrected voltage reading VC(T) at the measured temperature T. It is to be understood that this is but one possible example of the temperature compensation or calibration method or algorithm, and that other substantial methods, algorithms, flow charts, software or firmware, or reduced instructions can be devised or formulated based on additive, summative, or multiplicative corrective or calibration factors based on temperature.

Another aspect of the present technology relates to a modular switchgear elbow optical voltage sensor device. The modular switchgear elbow optical voltage sensor device includes a sensor body having a first end and a second end. The second end includes a sensor cavity configured to house an optical sensor crystal and a cable cavity configured to house one or more fiber optic cables. An internal pickoff rod is located in the first end of the sensor body. An external pick-off rod is connected to the internal pickoff rod at a pickoff rod connection point within the sensor body, such that the external pickoff rod and the internal pickoff rod form substantially a right angle. A base cap is configured to be attached to the sensor body. The base cap includes a fiber optic cable strain relief to allow one or more fiber optic cables to pass from the sensor body, through the base cap, and external to the modular switchgear elbow optical voltage sensor device.

Referring now to FIGS. 9-13, a modular optical voltage sensor device 100 that may incorporate an example of the optical voltage sensor assembly 12 described above in accordance with the present technology for use with switchgear elbows is described. The modular optical voltage sensor device 100 includes an elbow cover 101, a sensor body 102, and a base cap assembly 103, although the modular optical voltage sensor device 100 may include other type and/or numbers of elements or components in other combinations. As used here in switchgear refers to an apparatus used for switching, controlling, and protecting the electrical circuits and equipment from faults. Specifically the switchgear referenced herein comprises the optical voltage sensor device 100 to monitor electrical distribution and detect faults. A switchgear is typically found in electrical substations and is often found at ground level or underground where the switchgear may be exposed to flooding or similar events wherein the sensor may become submerged underwater.

The technology described relates to an application for all-optical sensor for detecting and measuring voltage or applied electric field on commercial switchgear. This is a unique application since the sensor must be capable of operating in conditions that may include flooding or similar exposure to water over a long period. Thus, the sensor must be housed in modular assembly as described below.

Figure 10:
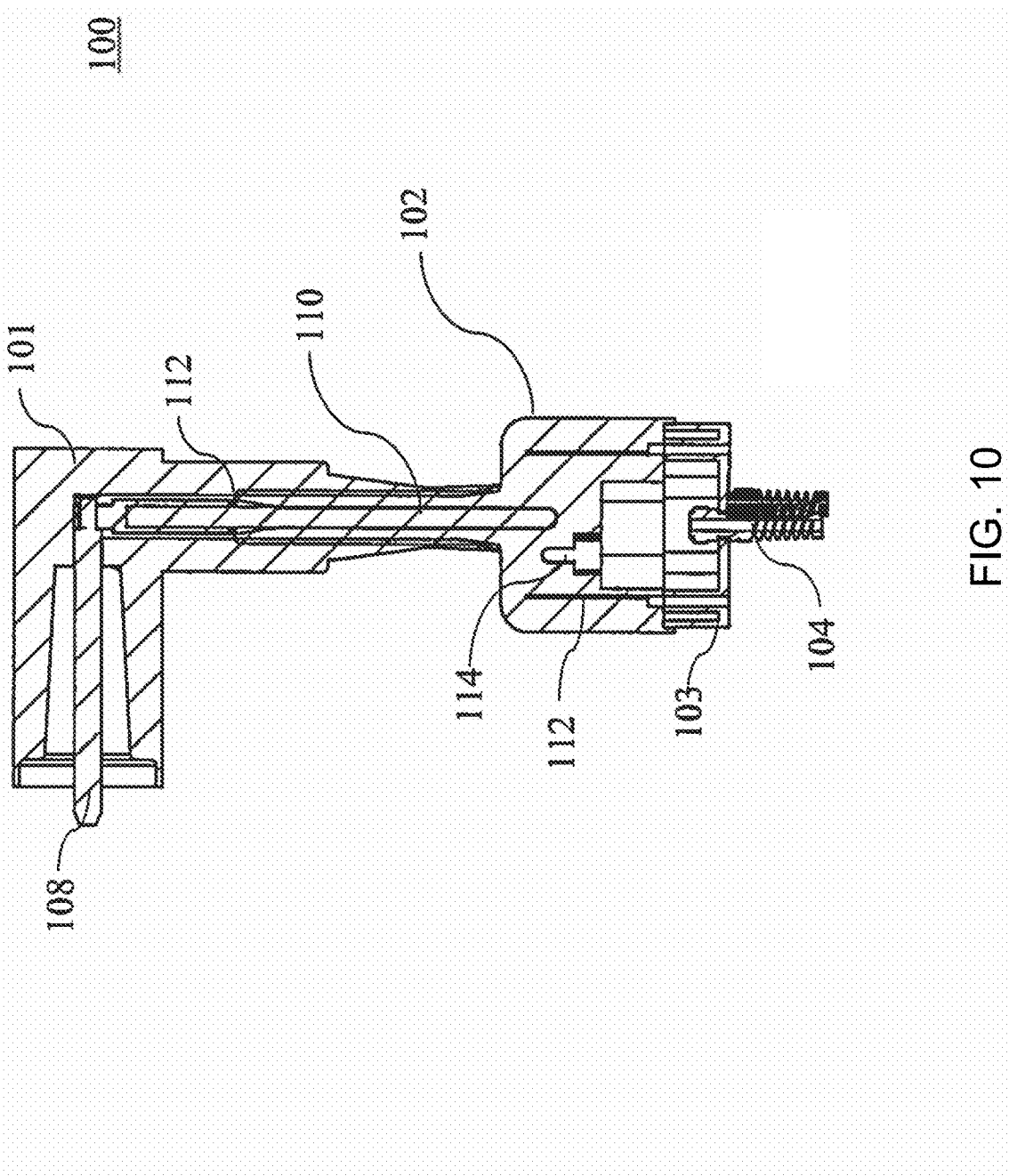
FIG. 10 is a cross-sectional view of an modular optical voltage sensor device as shown in FIG. 9.

In this example, the elbow cover 101 is a commercially available elbow cover that is configured to be mated with the sensor body 102. Referring more specifically to FIG. 10, the elbow cover 101 includes a conductive external pick-off rod 108 and a conductive internal pick-off rod 110 that connect at a pick-off rod connection 112. The external pick-off rod 108 and the internal pick-off rod 110 interconnect at a right angle and serve to channel high voltage into the sensor body 102. As used herein, a pick-off rod refers to a conductive material that has a physical connection between the high voltage electricity source of the switchgear that generates an electric field between the tip of the pick-off rod and to the crystal material of the optical voltage sensor assembly, such as the optical voltage sensor assembly 12 as described above.

Figure 11:
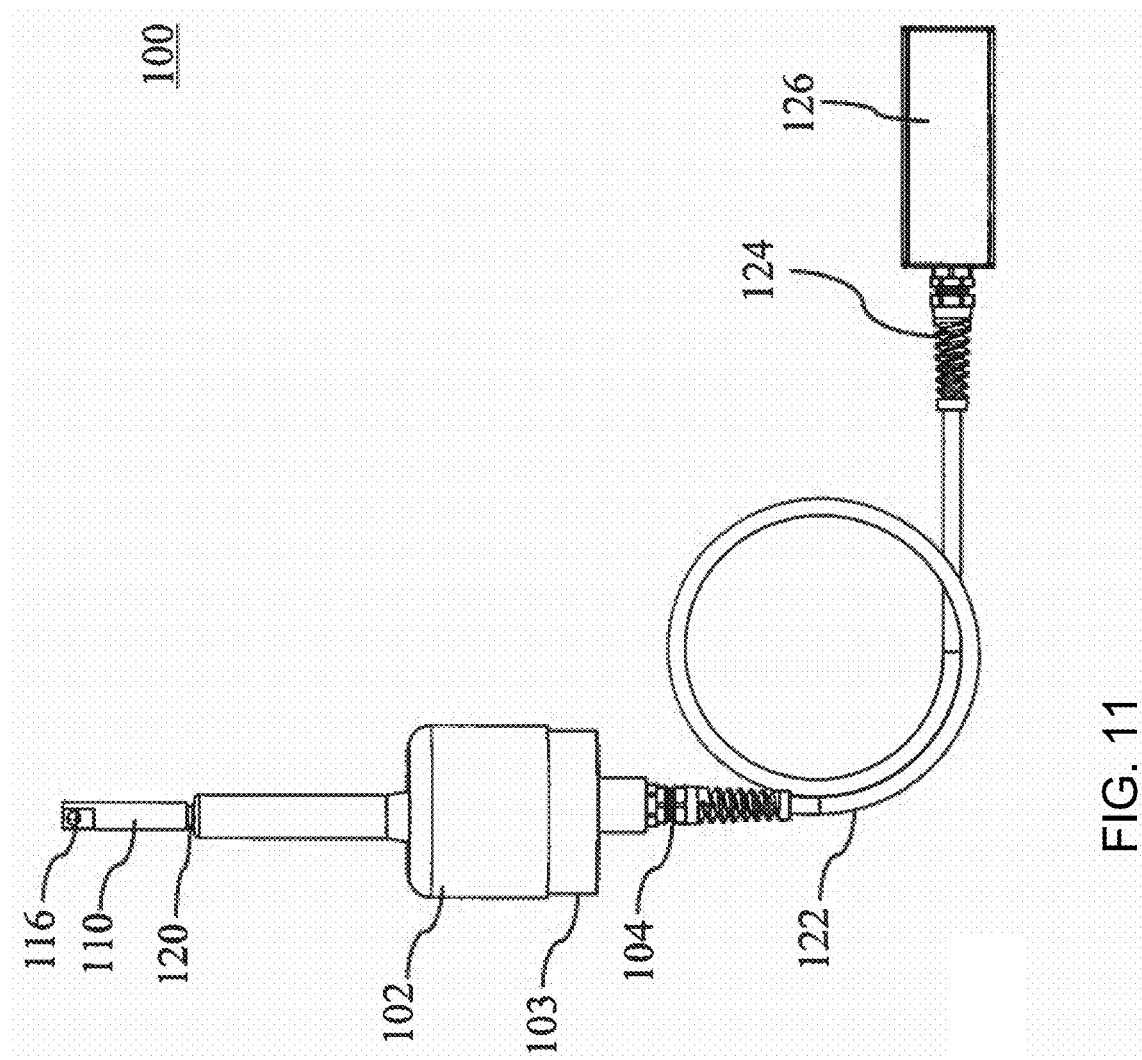
FIG. 11 is a schematic view the sensor body of the modular optical voltage sensor device as shown in FIG. 9 with the elbow portion removed.

The sensor body 102 is formed of an epoxy, although other materials may be utilized. The sensor body 102 is configured to encapsulate the components of the optical voltage sensor assembly 12 of the present technology as described above, and provides a watertight system for protecting the optical components of the optical voltage sensor assembly 12. The sensor body 102 serves as an electrical insulator and comprises a ground cage 112 and a preformed cavity 114 to accommodate the voltage sensor crystal (not shown), such as the crystal material 26 as described above. The present technology forms an application, which precisely mounts the position of the internal pick-off rod 110 in relation to the ground cage 112 and the preformed sensor cavity 114. Referring now to FIG. 11, an electrical connection point with threaded mounting hole 116 and an external pick-off rod connection 118 are provided, which together act to hold the external pick-off rod 108 in place with the internal pick-off rod 110 as shown in FIG. 10. A sealing gasket 120 is positioned around the external pick-off rod connection 118 adjacent to the narrow end of the electrical insulator sensor body 102. Referring to FIG. 13, the custom internal pick-off rod 110 is shown, which includes the electrical connection point with threaded mounting hole 116 that provides a solid assembly point for connection with the external pick-off rod 108, as shown in FIG. 10, for use with the elbow. The sensor body 102 precisely aligns the elbow mounting post 116.

The base cap 103 is configured to close off the body of the sensor body 102 and to provide a solid support for a fiber management, watertight cable fitting 104 and grounding. In one example, the base cap 103 is composed of silicon bronze to reduce corrosion, although other materials may be utilized. The base cap 103 connects to the insulator sensor body 102 and serves as an electrical low potential connection point. The base cap 103 further serves as a watertight entry point for optical fiber cabling through watertight cable fitting 104 and provides strain relief. Referring more specifically to FIG. 12, the conductive base cap 103 includes a gasket sealing area 128 as well as an integrated ground lug mounting 130. The base cap 103 coupled to the sensor body 102 serves as an electrical low potential connection point and provides an attachment point for the fiber optic cable strain relief through which fiber optic cables 122 pass. In this example, the fiber optic cables 122 pass through a second fiber optic cable strain relief 124 to an electro-optical module 126 that processes the optical signals in accordance with the methods described above.

Unlike optical voltage sensors developed for measuring overhead voltage, the modular optical voltage sensor device 100 requires significant component modifications to enable function with a right angle bend in the pick-off rod of a switchgear elbow. For example, the modular optical voltage sensor device 100 for use in either an elbow or T-type configuration requires a more compact body versus overhead sensors, so that it can be accommodated in underground and switchgear situations.

Additionally, modifications must be made to the optical fibers in order to be usable with the right angle bends of the sensor casing. The pick-off rod must be made of non-traditional metals, such as bronze, silicon bronze and silicon steels, rather than the metal used in traditional optical voltage sensors, which include stainless steel or aluminum. Finally, components of the modular optical voltage sensor device 100, including the crystal, the pick-rods, the drip edge, and the optical fibers, as described below, must be able to easily integrate with existing rubber housings used for sensors with elbow or T-type configurations.

The present technology provides a modular all-optical sensor, for detecting and measuring voltage or applied electric field, specifically adapted for use as switchgear, wherein it is likely to be exposed to flooding or high moisture situations. The modularity of the sensor device allows for it to be easily adapted for use in all elbow configurations and T-type configurations available for load break and dead break products. Thus, the modular all-optical sensor of the present invention provides a one-size fits all solution for use with switchgear and voltage monitoring in ground-based and underground applications.

The technology disclosed here includes all components needed for a modular all-optical modular voltage sensor, including the crystal, the pick-off rods, a drip edge, and optical fibers, such that said components can be used with any commercially available rubber elbow or T-type connectors irrespective of size and configuration of the casing.

A key challenge in developing the present switchgear system is the need to ensure environmental stability. This is particularly true when the system may be used in underground environments subject to flooding, where corrosion becomes an issue. The optical voltage sensors known in the art comprise pick off rods made of materials such as stainless steel or iron. While such materials are suitable for above the ground uses, they would rapidly corrode if used for underground applications. Thus, the internal pick off rod 110, as illustrated in FIG. 13, of the present technology requires customization such that the internal pick off rod 110 includes a conductive material that is not corrosive. In some examples, the internal pick-off rod 110, the external pick-off rod 108, and the base cap 103 are constructed of a bronze, silicon bronze, or a silicon steel material, although other non-corrosive conductive materials may be utilized.

The modular all-optical sensor of the present invention requires significant component modifications relative to overhead optical voltage sensors. In addition to using special materials for the pick-up off rod, modifications include features such as modular pick-off rods that can form right angles, as well as a compact body that can be accommodated in underground and switchgear situations. Finally, components of the modular system, including the optical sensor crystal, the pick-rods, the drip edge, and the optical fibers must be able to easily integrate with existing rubber housings used for sensors with elbow or T-type configurations.

Figure 14A:
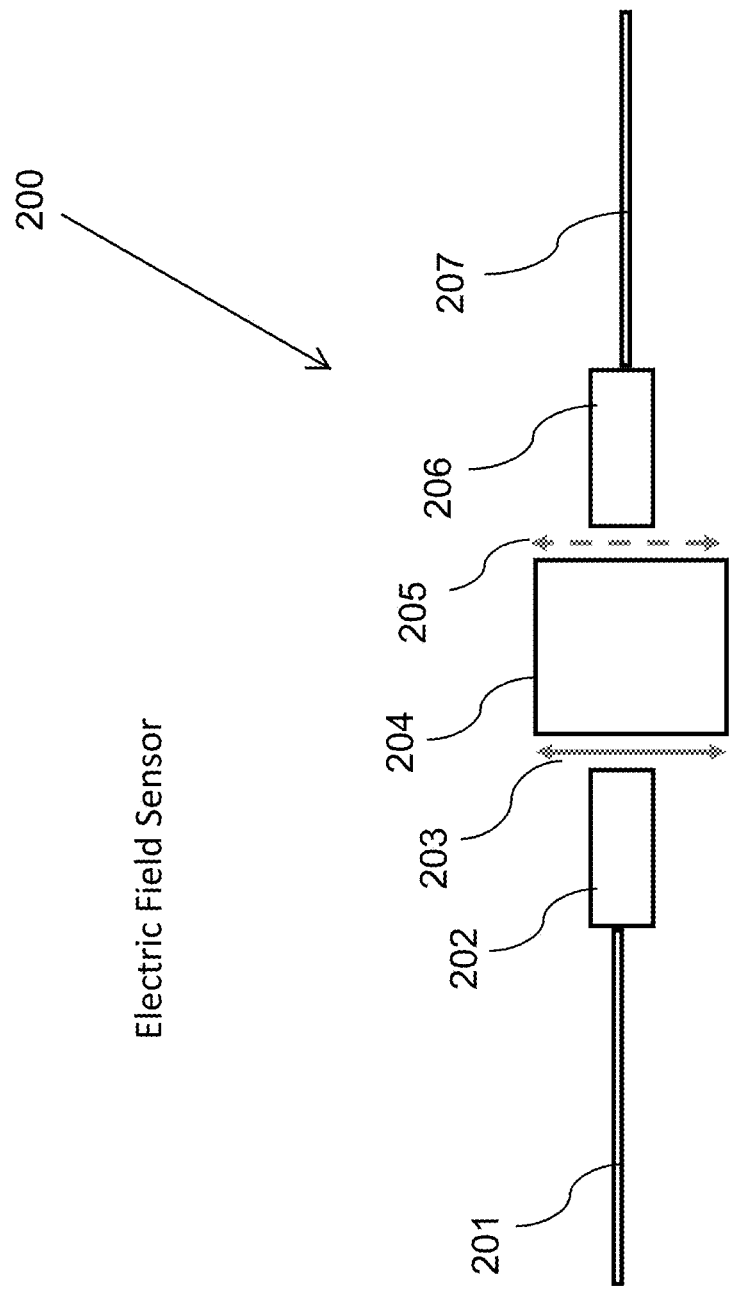
FIGS. 14A and 14B are schematics views of the components of an exemplary low voltage optical voltage sensor assembly.
Figure 14B:
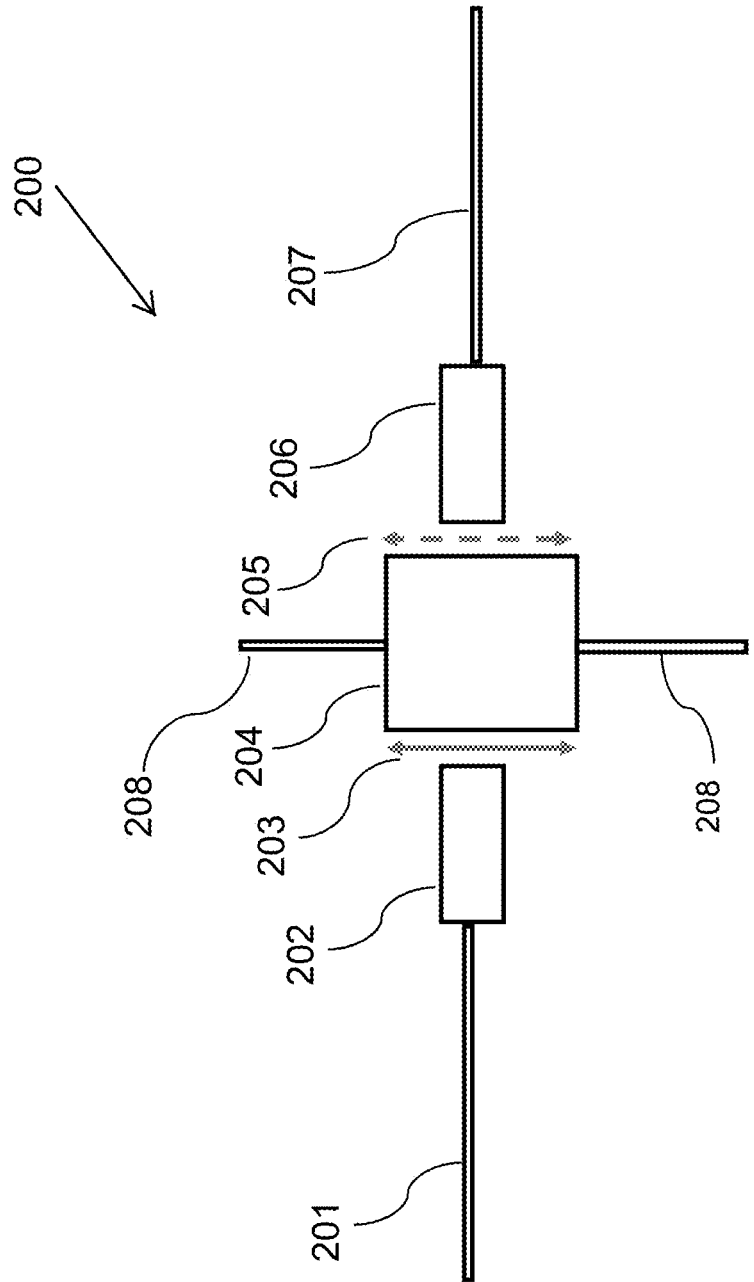

FIGS. 14A and 14B show another exemplary embodiment of an optical voltage sensor assembly 200 of the present technology that may be utilized in low voltage (i.e. less than 1 kV) applications with the system 10 described above. The optical voltage sensor assembly 200 includes an input fiber waveguide 201, an input collimator 202, a polarizer 203, a crystal material 204, an analyzer 205, an output collimator 206, and an output fiber waveguide 207, although the optical voltage sensor assembly 200 may include other types and/or numbers of elements or components in other combinations. The structure and operation of the optical voltage sensor assembly 200 is the same as described with respect to optical voltage sensor assembly 12 except as described below. The technology described will have applications at the distribution bus of a power grid system, at regulator banks for regulating meters, for switching, and at distribution taps for single-phase tap meter to residential, end-use industrial, or business users. In particular, this example focuses on measuring voltage after final stepdown, and thus has metering applications at all voltages≤1000 volts at either 50 or 60 Hz, including the 120 volt, 240 volt, and 480 volt levels encountered on global electricity grids.

FIG. 14A is a schematic view the optical voltage sensor assembly 200 that may be employed as an electric field sensor. The input optical fiber waveguide 201 is connected to a light source (not shown) and connects to the input collimator 202 that is configured to collimate the light beam delivered from the light source, such as light source 14 as described above.

The light polarizer 203 is positioned between the input collimator 102 and the crystal material 204. The crystal material 204 is the same as the crystal material 26 as described above. One non-limiting example of the Pockels crystal material 204 is a Lithium Niobate crystal, although other Pockels crystals may be utilized.

A light analyzer 205 is positioned between the Pockels crystal material 204 and the output collimator 206, which is connected to the output optical fiber waveguide 207. In some examples, such as illustrated in FIG. 14B, the optical voltage sensor assembly 200 includes electrodes 208 that directly contact the Pockels crystal material 204. While FIGS. 14A and 14B show an example of the optical voltage sensor assembly 200 in a linear form, those skilled in the art will understand that other configurations are possible.

In one example operation, the optical voltage sensor assembly 200, as shown in FIG. 14A by way of example, is placed in an electric field, while the input optical fiber 201 carries incoherent, coherent, or partially coherent light into the input collimator 202, and through the polarizer 203. The beam of light introduced through the input optical fiber 201 is thus linearly polarized and enters the Pockels crystal material 204 at a phase angle fixed by the polarizer 203. As the light passes through the Pockels crystal material 204 its phase shifts in proportion to the strength or potential of the electric field as it travels to the analyzer 205. From the analyzer 205 the light travels to the output collimator 206 and then to the output fiber waveguide 207. The output fiber waveguide 207 may deliver the output light to a detector, such as detector 16 as described above.

In a second example operation, the optical voltage sensor assembly 200, as shown in FIG. 14B, has the electrodes 208 that directly contact the Pockels crystal material 204. In this example, the input optical fiber 201 carries light into the input collimator 202 and through the polarizer 203. The beam of light is thus linearly polarized and enters the Pockels crystal material 204 at an angle fixed by the polarizer 203. As the light passes through the Pockels crystal material 204 its phase shifts in proportion to the strength of the electrical potential or voltage applied by the electrodes 208, as it travels to the analyzer 205. From the analyzer 205 the light travels to the output collimator 206 and then the output fiber waveguide 207. The output fiber waveguide 207 may deliver the output light to a detector, such as detector 16 as described above.

Figure 15B:
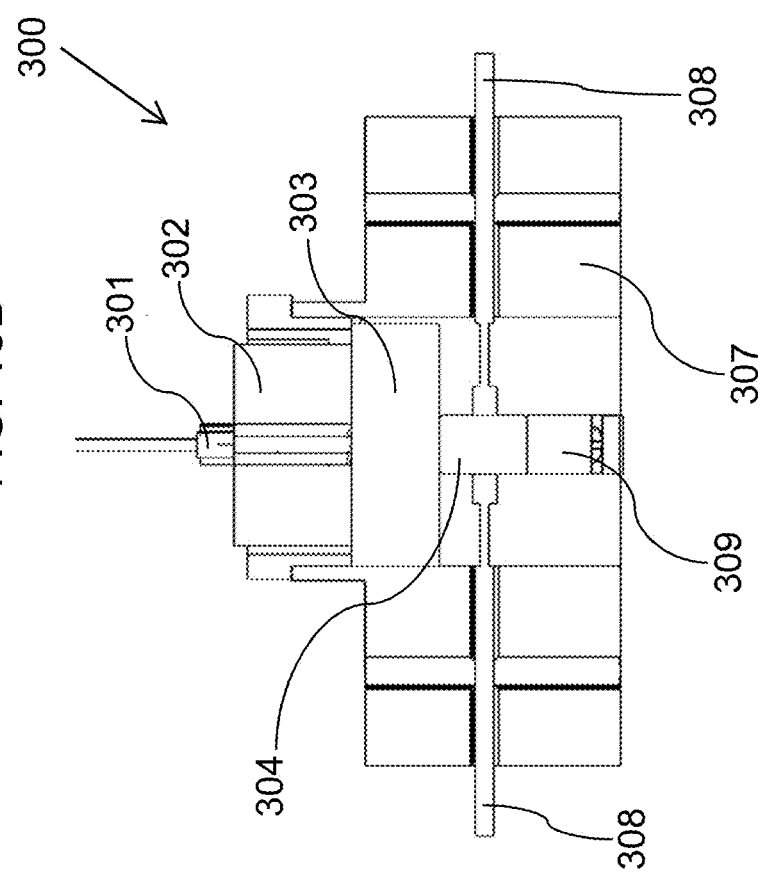
FIGS. 15A and 15B are side views of the sensors illustrated in FIGS. 14A and 14B.
Figure 15A:
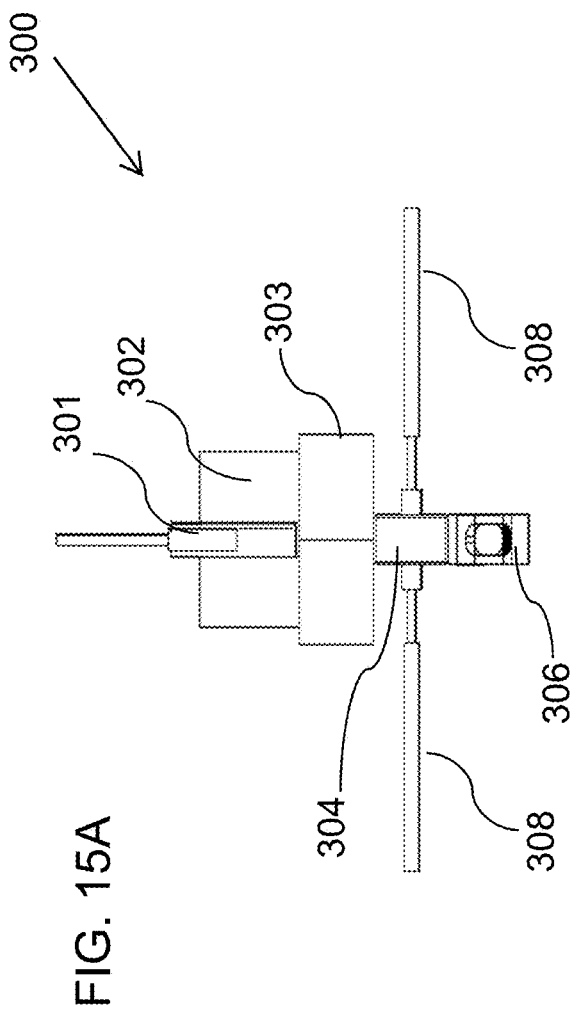

FIG. 15A shows another example of a low voltage optical electric field sensor 300. In this example, a fiber collimator 301 (this could be an input or output fiber collimator depending on orientation) is held in place by a collimator block 302. The collimator block 302 provides mechanical stability and protection for the collimator 301 as it attaches to a glass spacer block 303. The glass spacer block 303 surrounds a Pockels crystal material 304 and reduces stress on the Pockels crystal material 304. The Pockels crystal material 304 comprises any crystal material known in the art, and in one non-limiting example the Pockels crystal material 304 comprises a Lithium Niobate crystal.

In this example, two conductive electrodes 308 contact the Pockels crystal 204 and carry a voltage to the Pockels crystal material 204. The electrodes 308 may comprise any conductive material known in the art. Non-limiting examples of conductive material that may be used for the electrodes 308 include metals, such as copper, silver, aluminum, or gold, electro-ceramics, conducting dielectric materials, and conducting fibers, although other conductive materials may be utilized. A prism cap 306 lies at the bottom of the low voltage optical voltage sensor assembly 300 and controls polarization properties of light upon total internal reflection (TIR) within the prism.

The glass spacer block 303 between the collimator block 302 and the Pockels crystal material 304 provides for a uniform and homogeneous optical interface, reducing thermal mismatch between the crystal and the glass materials. The surfaces of the glass spacer block 303 are flat with minimal curvature and low surface roughness in order to provide optimal surfaces for bonding the collimator block 302 assembly with the collimator 301 and the crystal material 304 thereby integrating the optical assembly. Bonding the components to the glass spacer block 303 minimizes fluctuations due to thermal variation of intrinsic birefringence in the optical assembly.

FIG. 15B is a more detailed illustration of the low voltage optical electric field sensor 300. showing all components described in FIG. 15A along with some additional structures, although the low voltage optical electric field sensor 300 may include other types/numbers of elements in other configurations. In this example, the low voltage optical electric field sensor 300 includes a sensor body 307 that provides a non-limiting example of one potential solution for assembly of the present technology. The sensor body 307 may be comprised of any material known in the art, including metal, plastic, rubber, carbon composite, or similar materials, although other suitable materials may be utilized for the sensor body 307. The sensor body 307 allows the sensor to be installed in various types of electrical boxes or enclosures. A retroreflecting prism 308 covers the prism cap 306 (FIG. 14A). The retroreflecting prism 308 provides for a double pass of light through the Pockels crystal material 304. The double path length of transmitted light in turn doubles the sensitivity of the device.

In an exemplary operation of the low voltage low voltage optical electric field sensor 300 shown in FIGS. 15A and 15B, light from an incoherent, coherent, or partially coherent source is delivered by the input fiber collimator 301, inserted into the collimator block 302, and travels through a polarizer and through the glass spacer block 303. The beam of light is thus linearly polarized entering the Pockels crystal material 304 along the direction of the optical axis (b-axis) of the Pockels crystal material 304. The polarization state has a non-zero projection with the a-axis and c-axis, and ideally for the case of Lithium Niobate is at 45 degrees with respect to the these axes.

The polarized light beam is reflected twice by the specially designed retroreflecting prism 308, and reenters the Pockels crystal material 304. Based on the Pockels effect, with an electrical field applied to the Pockels crystal material 304, such as through the electrodes 308, by way of example, an optical phase is imparted to the light beam, which is then, in general, elliptically polarized. Upon exiting the Pockels crystal material 304, the light with imparted optical phase is incident on the output polarizer, or analyzer. The orientation of the analyzer ideally is coincident with the polarization vector of the light producing maximum modulation of light associated with the time dependent electric field applied across the Pockels crystal material 204. For Lithium Niobate in a transverse modulator configuration (equation 8), this corresponds to the semi-major axis of the outgoing elliptically polarized light.

The output polarizer or analyzer (in similarity to the input polarizer) can be embedded, bonded, or attached to the output collimator 301, through which the light is fiber-optically coupled as it exits the optical assembly, or it can also be attached to other portions or components of the optical assembly after exiting the crystal, such as the collimator block 302.

Figure 16:
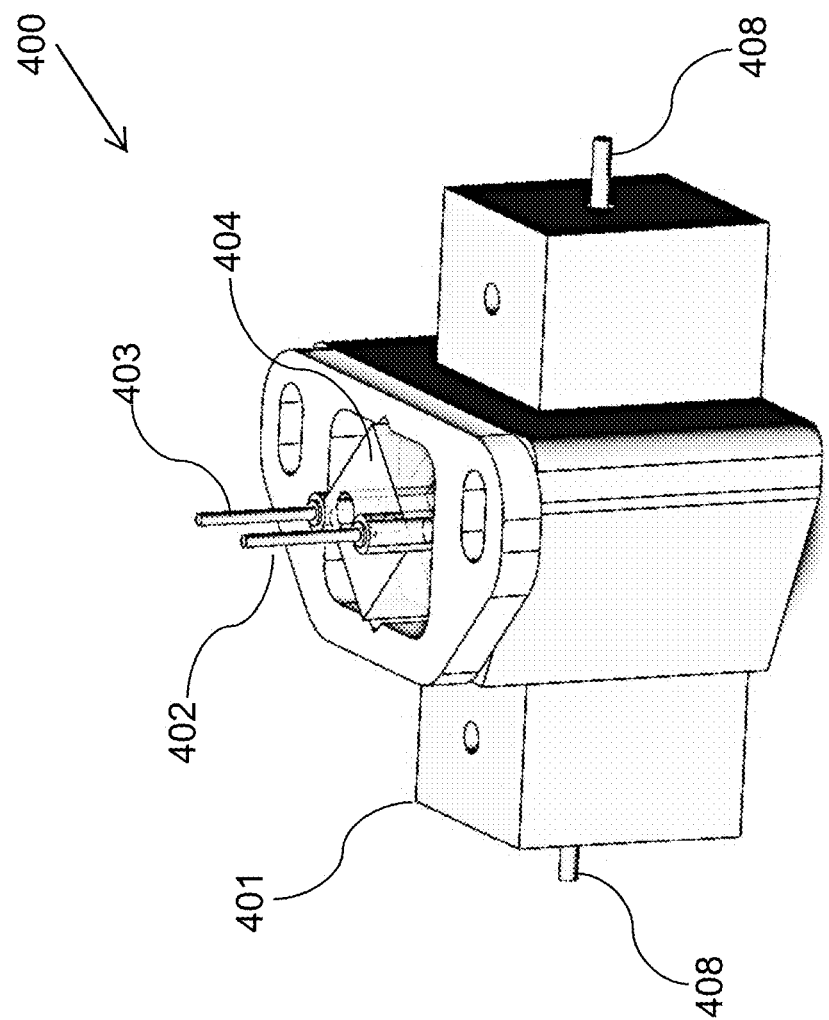
FIG. 16 shows an exemplary top view of the present technology in a fully encased example.

FIG. 16 shows a top-view perspective of another exemplary low voltage optical electric field sensor 400. It should be noted that while references will be made to the top and sides of the low voltage optical voltage sensor assembly 400, these references are relative to the orientation of the figure, and in no way, limit the orientation of sensor components in real world applications.

In this example, the low voltage optical voltage sensor assembly 400 comprises a case 401 that allows the low voltage optical electric field sensor 400 to be easily attached to various surfaces including those of enclosures. It should be clear to those skilled in the art that the case 401 may have any suitable configuration and may be constructed of any suitable materials.

In this example, an input collimator 402 and an output collimator 403 are shown exiting the top of the low voltage optical voltage sensor assembly 400. The input collimator 402 and the output collimator 403 are held in place by a collimator block 404. In some examples, the input collimator 402 comprises a polarizer while in other embodiments a polarizer (not shown) is placed between the input collimator 402 and the Pockels crystal material (not shown). Similarly, in some examples, the output collimator 403 comprises an analyzer or polarizer while in other embodiments an analyzer or polarizer (not shown) is placed between the input collimator 403 and the Pockels crystal material (not shown). Potential carrying electrodes 408 are shown at both sides of the low voltage optical voltage sensor assembly 400. These conductive electrodes 408 directly contact that Pockels crystal (not shown).

Operation of the low voltage optical voltage sensor assembly 400 of FIG. 16 requires that light pass from the input collimator 402 and any polarizer present into the Pockels crystal material (not shown) and the retro-reflecting prism complex (not shown), such that the collimated light passes through the Pockels crystal material (not shown) two times before passing back into the output collimator 403. When a voltage potential is applied to the electrodes 408, the voltage potential causes a phase shift of light passing through the Pockels crystal material (not shown). The magnitude of this phase shift, known as the Pockels effect, correlates to the voltage potential being applied to the Pockels crystal material. Thus, when a voltage potential is applied to the electrodes 408, and hence the Pockels crystal material, the phase of collimated light emanating out of the output collimator 403 will be shifted relative to the phase of light at the input collimator 402. By analyzing the difference in phase of the output light versus the input light, and applying algorithms, the voltage potential can be determined.

Applications for the present technology include measuring and monitoring voltage and power in numerous situations where low voltage circuits are present (i.e., ≤1000 volts). These applications can include both single and three phase circuits. Broad examples of applications include use on a distribution bus of a power grid system, a regulator bank as a regulating meter, in switching, and at distribution taps as a single or three phase tap meter to residential or end-use industrial or business lines.

Non-limiting examples of uses may include measuring voltage of electricity being fed into residential buildings, office buildings, industrial facilities, and electrical vehicle (EV) charging stations. The present technology may also be used by entities outside of the electrical distribution industry. For example, the examples of low voltage sensors described herein may be used to manage energy use within smart buildings, within manufacturing facilities, or within other industrial complexes. It may also be used in the transportation industry to monitor electricity used for high speed rail, commuter rail, subways, and trams. Other non-limiting uses within transportation could include monitoring voltage on nautical vessels or aircraft. In addition, the present technology can be used in systems that facilitate the control of electricity demand. As such it can serve as a component of an intelligent circuit breaker that reacts to load demand (e.g., peak demand, etc.).

Having thus described the basic concept of the invention, it will be apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Accordingly, the invention is limited only by the following claims and equivalents thereto.

What is claimed is:

1. An optical voltage sensor assembly comprising:
 an input collimator positioned and configured to collimate an input light beam from a light source;
 a crystal material positioned to receive the input light beam from the light source and configured to exhibit the Pockels effect when an electric field is applied through the crystal material;
 an output collimator positioned to receive an output light beam from the crystal material and configured to focus the output light beam from the crystal material onto a detector configured to measure the optical phase change between the input light beam and the output light beam based on the Pockels effect;
 a temperature sensor configured to measure temperature in the area of the optical voltage sensor assembly; and
 a sensor computing device coupled to the detector and the temperature sensor, the sensor computing device comprising a processor and a memory coupled to the processor, wherein the processor executes programmed instructions stored in the memory to:
  determine, based on the measured optical phase change based on the Pockels effect, a voltage drop across the crystal material; and
  apply one or more calibration factors to the determined voltage drop across the crystal material based on the measured temperature from the temperature sensor to determine a corrected voltage.

2. The optical voltage sensor assembly of claim 1, wherein the crystal material is a non-centrosymmetric crystal material.

3. The optical voltage sensor assembly of claim 2, wherein the non-centrosymmetric crystal material is one of crystal point group symmetry 3m, 42m, 43m, m3m, 4 mm, 2 mm, or 23.

4. The optical voltage sensor assembly of claim 1, wherein the crystal material is selected from the group consisting of $C_6H_5O_2N$, $Pb_{0.814}La_{0.124}(Ti_{0.6}Zr_{0.4})O_3$ (PLZT), β-Zns, ZnSe, ZnTe, $Bi_{12}SiO_{20}$, $Ba_{0.25}Sr_{0.75}Nb_2O_6$, $Kta_{0.35}Sr_{0.75}Nb_{0.65}O_3$, $CsH_2AsO_4$, $NH_4H_2PO_4$, $NH_4D_2PO_4$, $KD_2PO_4$, $KH_2PO_4$, Lithium Niobate ($LiNbO_3$), $LiTaO_3$, $BaTiO_3$ $SrTiO_3$, $Ag_3AsS_3$, $KNbO_3$, and electro-optic polymers.

5. The optical voltage sensor assembly of claim 1, further comprising:
an input linear polarizer positioned and configured to polarize the input light beam from the light source; and
an output linear polarizer positioned and configured to polarize the output light beam from the crystal material.

6. The optical voltage sensor assembly of claim 5, wherein the input linear polarizer and the output linear polarizer have a thickness of less than about 1.0 mm.

7. The optical voltage sensor assembly of claim 1 further comprising:
a retro-prism device coupled to the crystal material and positioned to receive light directed from the input collimator through the crystal material, wherein the retro-prism device is configured to redirect the light received through the crystal material back through the crystal material to the output collimator.

8. The optical voltage sensor assembly of claim 1, wherein the temperature sensor is coupled to a component of the optical voltage sensor assembly.

9. The optical voltage sensor assembly of claim 1, wherein the temperature sensor comprises one of a GaAs bandgap fiber-optic temperature sensor, a fluorescence fiber-optic temperature sensor, an electrical temperature sensor, or a mechanical temperature sensor.

10. The optical voltage sensor assembly of claim 1 further comprising:
a pair of electrodes in contact with the crystal material, wherein the pair of electrodes are positioned to provide a voltage potential across the crystal material.

11. A method for measuring voltage comprising:
providing the optical voltage sensor assembly of claim 1;
subjecting the crystal material of the optical voltage sensor assembly to an applied electric field;
measuring the optical phase change between the input light beam and the output light beam based on the Pockels effect; and
determining the voltage drop across the crystal material based on the measured optical phase change between the input light beam and the output light beam and one or more properties of the crystal material.

12. The method of claim 11 further comprising:
measuring the temperature near the crystal material of the optical voltage using the temperature sensor; and
applying one or more calibration factors to the determined voltage drop across the crystal material based on the measured temperature to determine the corrected voltage.

13. The method of claim 12, wherein the temperature sensor is coupled to a component of the optical voltage sensor assembly.

14. The method of claim 11, wherein the temperature sensor comprises one of a GaAs bandgap fiber-optic temperature sensor, a fluorescence fiber-optic temperature sensor, an electrical temperature sensor, or a mechanical temperature sensor.

15. The method of claim 11, wherein the crystal material is a non-centrosymmetric crystal material.

16. The method of claim 15, wherein the non-centrosymmetric crystal material is one of crystal point group symmetry 3m, 42m, 43m, m3m, 4 mm, 2 mm, or 23.

17. The method of claim 11, wherein the crystal material is selected from the group consisting of $C_6H_5O_2N$, $Pb_{0.814}La_{0.124}(Ti_{0.6}Zr_{0.4})O_3$(PLZT), β-Zns, ZnSe, ZnTe, $Bi_{12}SiO_{20}$, $Ba_{0.25}Sr_{0.75}Nb_2O_6$, $Kta_{0.35}Sr_{0.75}Nb_{0.65}O_3$, $CsH_2AsO_4$, $NH_4H_2PO_4$, $NH_4D_2PO_4$, $KD_2PO_4$, $KH_2PO_4$, Lithium Niobate ($LiNbO_3$), $LiTaO_3$, $BaTiO_3$ $SrTiO_3$, $Ag_3AsS_3$, $KNbO_3$, and electro-optic polymers.

18. The method of claim 11, wherein the optical voltage sensor assembly further comprises an input linear polarizer positioned and configured to polarize the input light beam from the light source, and an output linear polarizer positioned and configured to polarize the output light beam from the crystal material.

19. The method of claim 18, wherein the input linear polarizer and the output linear polarizer have a thickness of less than about 1.0 mm.

20. The method of claim 11, wherein the optical voltage sensor assembly further comprises:
a retro-prism device coupled to the crystal material and positioned to receive light directed from the input collimator through the crystal material, wherein the retro-prism device is configured to redirect the light received through the crystal material back through the crystal material to the output collimator.

21. The method of claim 11, wherein the optical voltage sensor assembly further comprises:
a pair of electrodes in contact with the crystal material, wherein the pair of electrodes are positioned to provide a voltage potential across the crystal material.

* * * * *